(12) United States Patent
DiPietro et al.

(10) Patent No.: US 8,128,832 B2
(45) Date of Patent: *Mar. 6, 2012

(54) PROCESSES AND MATERIALS FOR STEP AND FLASH IMPRINT LITHOGRAPHY

(75) Inventors: Richard Anthony DiPietro, Campbell, CA (US); Mark Whitney Hart, San Jose, CA (US); Frances Anne Houle, Fremont, CA (US); Hiroshi Ito, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 917 days.

This patent is subject to a terminal disclaimer.

(21) Appl. No.: 12/051,584

(22) Filed: Mar. 19, 2008

(65) Prior Publication Data
US 2008/0169268 A1 Jul. 17, 2008

Related U.S. Application Data

(63) Continuation of application No. 11/219,095, filed on Sep. 2, 2005, now Pat. No. 7,419,611.

(51) Int. Cl.
*H01L 21/302* (2006.01)
(52) U.S. Cl. .............. 216/41; 216/44; 216/53; 216/67; 264/320; 430/313; 438/700
(58) Field of Classification Search .................. None
See application file for complete search history.

(56) References Cited

U.S. PATENT DOCUMENTS

| | | | |
|---|---|---|---|
| 4,757,098 A | 7/1988 | Merrem et al. | |
| 5,260,172 A * | 11/1993 | Ito | 430/323 |
| 5,514,727 A | 5/1996 | Green et al. | |
| 5,695,910 A | 12/1997 | Urano et al. | |
| 5,712,078 A | 1/1998 | Huang et al. | |
| 5,780,206 A | 7/1998 | Urano et al. | |
| 6,334,960 B1 | 1/2002 | Willson et al. | |
| 6,686,124 B1 | 2/2004 | Angelopoulos et al. | |
| 6,703,190 B2 | 3/2004 | Elian et al. | |
| 6,719,915 B2 | 4/2004 | Willson et al. | |
| 6,723,488 B2 | 4/2004 | Kudo et al. | |

(Continued)

OTHER PUBLICATIONS

E. K. Kim et al.; Vinyl Ethers in Ultraviolet Curable Formulations for Step and Flash Imprint Lithography; 2004 American Vacuum Society; J. Vac. Sci. Technol., B 22(1); Jan./Feb. 2004; pp. 131-135.

(Continued)

*Primary Examiner* — Anita Alanko
(74) *Attorney, Agent, or Firm* — Schmeiser, Olsen & Watts

(57) ABSTRACT

A method of forming an image. The method includes: a transfer layer on a substrate; forming on the transfer layer, an etch barrier layer; pressing a template having a relief pattern into the etch barrier layer; exposing the etch barrier layer to actinic radiation forming a cured etch barrier layer having thick and thin regions corresponding to the relief pattern; removing the template; removing the thin regions of the cured etch barrier layer; removing regions of the transfer layer not protected by the etch barrier layer; removing regions of the substrate not protected by the transfer layer and any remaining etch barrier layer; and removing remaining transfer layer. The transfer layer may be removed using a solvent, the etch barrier layer may include a release agent and an adhesion layer may be formed between the transfer layer and the etch barrier layer. A reverse tone process is also described.

33 Claims, 9 Drawing Sheets

U.S. PATENT DOCUMENTS

| | | | |
|---|---|---|---|
| 6,747,071 B1 | 6/2004 | Frances | |
| 7,148,142 B1 * | 12/2006 | Dakshina-Murthy et al. | 438/678 |
| 7,163,888 B2 * | 1/2007 | Gehoski et al. | 438/627 |
| 7,396,475 B2 * | 7/2008 | Sreenivasan | 216/2 |
| 7,419,611 B2 * | 9/2008 | DiPietro et al. | 216/54 |
| 7,488,771 B2 * | 2/2009 | Houle et al. | 524/588 |
| 7,670,747 B2 * | 3/2010 | Ikugata et al. | 430/270.1 |
| 7,749,422 B2 * | 7/2010 | Allen et al. | 264/496 |
| 2002/0120070 A1 | 8/2002 | Hong et al. | |
| 2002/0127789 A1 | 9/2002 | Hong et al. | |
| 2003/0003397 A1 | 1/2003 | Hong et al. | |
| 2003/0008240 A1 * | 1/2003 | Elian et al. | 430/285.1 |
| 2003/0219992 A1 | 11/2003 | Schaper | |
| 2004/0046271 A1 | 3/2004 | Watts | |
| 2004/0116548 A1 * | 6/2004 | Willson et al. | 522/31 |
| 2004/0188614 A1 | 9/2004 | Nakamura | |
| 2004/0197706 A1 | 10/2004 | Wada et al. | |
| 2004/0253537 A1 | 12/2004 | Rushkin et al. | |
| 2004/0253542 A1 | 12/2004 | Rushkin et al. | |
| 2006/0111454 A1 * | 5/2006 | Xu et al. | 516/199 |

OTHER PUBLICATIONS

S. C. Johnson et al.; Advances in Step and Flash Imprint Lithography; http://www.molecularimprints.com/NewsEvents/tech_articles/new_articles/UT_SFIL_SPIE_2003.pdf.

Ito, Hiroshi; Top Surface Imaging Systems Utilizing Poly(Vinylbenzoic Acid) and Its Ester; Journal of Photopolymer Science and Technology; vol. 5; No. 1 (1992); pp. 123-140.

Willson Research Group; The University of Texas at Austin; SFIL Process; http://willson.cm.utexas.edu/Research/Sub_Files/SFIL/Process/index.htm.

Chambers et al; Dissolution Inhibitors for 157 nm Photolithography; Advances in Resist Technology and Processing XX, Theodore H. Fedynyshyn, Editor, Proceedings of SPIE vol. 5039 (2003); pp. 93-102.

* cited by examiner

PROCESSES AND MATERIALS FOR STEP AND FLASH IMPRINT LITHOGRAPHY

This application is a continuation of U.S. patent application Ser. No. 11/219,095 filed on Sep. 2, 2005, now U.S. Pat. No. 7,419,611, issued Sep. 2, 2008.

FIELD OF THE INVENTION

This invention relates to processes for step and flash imprint lithography and materials for use in step and flash imprint lithography.

BACKGROUND OF THE INVENTION

Step and flash imprint lithography (SFIL) has emerged as an alternative to conventional micro-photolithographic imaging processes because of its reduced cost and ability to print smaller images. In SFIL, a photosensitive molding material is molded between a template having a relief pattern and a substrate, exposed to actinic radiation and the resulting hardened layer, having a three dimensional pattern, used to form a pattern in a transfer layer used as a mask in subsequent etching processes of an underlying layer or substrate. However, current SFIL suffers from several difficulties, including shelf life of the molding material, stripability of the transfer layer, image size control, poor adhesion of the various layer interfaces and excess adhesion of the template to the molding material.

Therefore, there is a need for SFIL processes having one or more of longer shelf life of the molding material, improved stripability of the transfer layer, improved image size control, improved layer interface adhesion and improved template release.

SUMMARY OF THE INVENTION

A first aspect of the present invention is a method of forming an image, comprising: forming on a substrate, a transfer layer of a transfer composition; forming on the transfer layer, an etch barrier layer of an etch barrier composition; pressing a surface of a template into the etch barrier layer, the a template having a relief pattern on the surface, the etch barrier layer filling voids in the relief pattern, the template not contacting the transfer layer; exposing the etch barrier layer to actinic radiation, the actinic radiation converting the etch barrier layer to a cured etch barrier layer having thick and thin regions corresponding to the relief pattern; removing the template; removing the thin regions of the cured etch barrier layer; removing regions of the transfer layer not protected by the etch barrier layer; removing regions of the substrate not protected by the transfer layer and removing any remaining etch barrier layer; and removing any remaining transfer layer by dissolving the remaining transfer layer in at least one of an aqueous base and an organic solvent.

A second aspect of the present invention is a method of forming an image, comprising: forming on a substrate, a transfer layer of a transfer composition; forming a coating of an adhesion promoter on the transfer layer; forming on the coating of the adhesion promoter, an etch barrier layer of an etch barrier composition; pressing a surface of a template into the etch barrier layer, the a template having a relief pattern on the surface, the etch barrier layer filling voids in the relief pattern, the template not contacting the transfer layer; exposing the etch barrier layer to actinic radiation, the actinic radiation converting the etch barrier layer to a cured etch barrier layer having thick and thin regions corresponding to the relief pattern; removing the template; removing the thin regions of the cured etch barrier layer; removing regions of the transfer layer and the regions of the coating of the adhesion promoter not protected by the etch barrier layer; removing regions of the substrate not protected by the transfer layer and removing any remaining etch barrier layer; and removing any remaining transfer layer.

A third aspect of the present invention is a method of forming an image, comprising: forming on a substrate, a transfer layer of a transfer composition; forming on the transfer layer, an etch barrier layer of an etch barrier composition, the etch barrier composition including a release agent; pressing a surface of a template into the etch barrier layer, the a template having a relief pattern on the surface, the etch barrier layer filling voids in the relief pattern, the template not contacting the transfer layer; exposing the etch barrier layer to actinic radiation, the actinic radiation converting the etch barrier layer to a cured etch barrier layer having thick and thin regions corresponding to the relief pattern; removing the template; removing the thin regions of the cured etch barrier layer; removing regions of the transfer layer not protected by the etch barrier layer; removing regions of the substrate not protected by the transfer layer and removing any remaining etch barrier layer; and removing any remaining transfer layer.

A fourth aspect of the present invention is a method of forming an image, comprising: forming on a substrate, a transfer layer of a transfer composition; forming on the transfer layer, a molding layer of a molding composition; pressing a surface of a template into the molding layer, the template having a relief pattern on the surface, the molding layer filling voids in the relief pattern, the template not contacting the transfer layer; exposing the molding layer to actinic radiation, the actinic radiation converting the molding layer to a cured molding layer having thick and thin regions corresponding to the relief pattern; removing the template; forming on the thin regions of the cured molding layer, etch barrier islands of a backfill composition, top surfaces of the thick regions of the cured molding layer exposed between the etch barrier islands; removing the thick regions of the cured molding layer; removing regions of the transfer layer not protected by the thin regions of the cured molding layer and the etch barrier islands; removing regions of the substrate not protected by the transfer layer and removing any remaining etch barrier islands; and removing any remaining transfer layer.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

DETAILED DESCRIPTION OF THE INVENTION

Figure 1A:
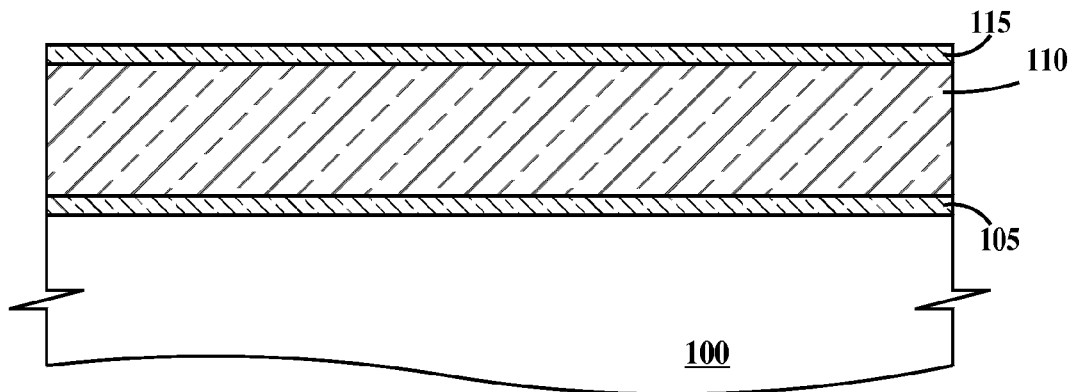
FIGS. 1A through 1I are cross-sectional drawings illustrating a SFIL process according to a first embodiment of the present invention.

FIGS. 1A through 1I are cross-sectional drawings illustrating a SFIL process according to a first embodiment of the present invention. In FIG. 1A formed on a top surface of a substrate 100 (or a layer of a material to be patterned on a substrate) is a optional first adhesion layer 105. Formed on a top surface of first adhesion layer 105 is a transfer layer 110. Formed on a top surface of transfer layer 110 is an optional second adhesion layer 115.

In one example, first adhesion layer 105 comprises hexamethyldisilazane (HMDS) or ethylsilicate, ethylorthosilicate, tetraalkoxysilane, aminoethylaminopropyltrialkoxysilane, aminopropyltrialkoxysilane, aminoethyltrialkoxysilane, tetralkoxytitanate or combinations thereof.

First adhesion layer 105 need only be a few mono-layers thick and may be applied by spin application of a dilute solution of the adhesion promoting material(s) in a solvent, by vapor deposition or by incorporation into the material used to form transfer layer.

Transfer layer 110 is advantageously an organic polymer that etches rapidly in an oxygen reactive ion etch (RIE) processes and slowly in a fluorocarbon species RIE processes. An RIE process is directional etch process. In one example, transfer layer 110 may comprise a thermosetting polymer, a thermoplastic polymer, a polyepoxy polymer, a polyamide polymer, a polyimide polymer, a polyurethane polymer, a polycarbonate polymer or a polyester polymer, and combinations thereof. Transfer layer 110 may be spin applied from a solution of the transfer layer material in an organic solvent. In the example that transfer layer 110 comprises polyimide, an adhesion promoter such as HMDS may be added to the polyimide casting solution.

In one example, transfer layer 110 may comprise poly(vinylbenzoic acid) PVBA. PVBA can be prepared by conventional radical polymerization with 2,2'-azobisisobutyronitrile (AIBN) or benzoyl peroxide (BPO) as the initiator. PVBA has a high glass transition temperature, is soluble in 2-ethoxyethanol, 2-methoxyethanol, and 1-methoxy-2-propanol, and aqueous base, and is insoluble in propylene glycol methyl ether acetate (PGMEA), cyclohexanone, and other common solvents. When transfer layer 110 comprises PVBA, the transfer layer may be spin applied from casting solution of PVBA in 2-ethoxyethanol, 2-methoxyethanol, and 1-methoxy-2-propanol or combinations thereof.

Second adhesion layer 115 may comprise the adhesion promoter material represented by the structure (I):

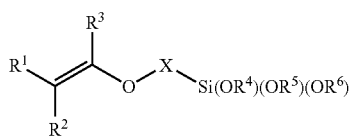

(I)

where X is a linking group selected from the group consisting of —C(O)O—, —C(O)—, —OC(O)—, —O—C(O)—C(O)—O—, NHC(O)—O—, —O—C(O)—O—, a linear or a branched alkylene having 1 to 7 carbon atoms, a cycloalkylene having 3 to 17 carbon atoms, an alkylcycloalkylene having 4 to 20 carbon atoms and a cycloalkylalkylene having 4 to 20 carbon atoms;

where each $R^1$, $R^2$, $R^3$, $R^4$, $R^5$, and $R^6$ ($R^1$-$R^6$) is independently selected from the group consisting of a hydrogen atom and a hydrocarbyl substituent with a primary, a secondary or a tertiary carbon attachment point, said hydrocarbyl group selected from the group consisting of an alkyl group, an alkenyl group, an alkynyl group, an aralkyl group, an alkaryl and an aryl group, each alkyl, alkenyl, alkynyl, aralkyl, alkaryl or aryl group having 1 to 20 carbon atom and each alkyl group of the aralkyl, or alkaryl groups may be linear, branched or cyclic and the aryl groups may include at least one carbon ring containing 3 to 8 carbon atoms; and any two $R^1$-$R^6$ in the same molecule may be linked to form the at least one carbon ring containing 3 to 8 carbon atoms.

In one example, the adhesion promoter is O-(vinyloxybutyl)-H-(triethoxysilylpropyl)-urethane (manufactured by Gelest, Inc., 11 East Steel Road, Morrisville, Pa. 19067).

Figure 1B:
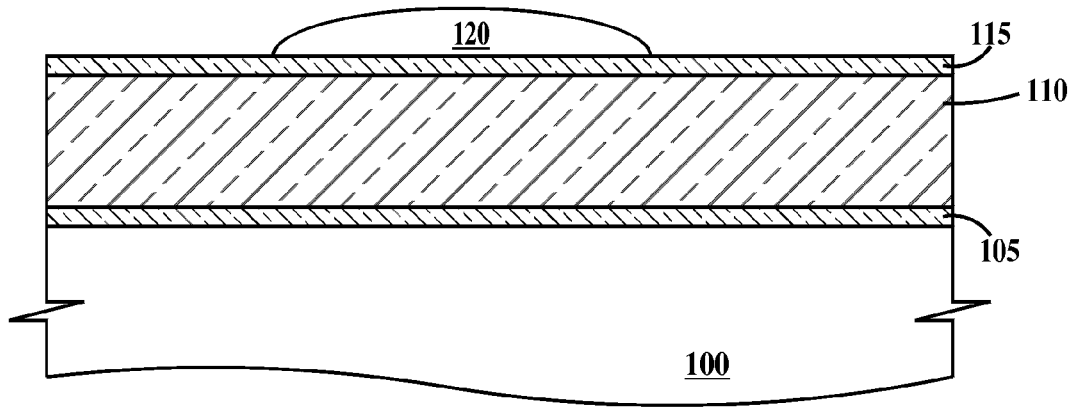

In FIG. 1B, a puddle of etch barrier composition 120 is dispensed on a top surface of adhesion layer 115 (or on a top surface of transfer layer 110 if adhesion layer 115 is not used). In one example, puddle of etch barrier composition 120 is applied using drops of between about 1 micron and about 200 microns in diameter.

In one example, the material of puddle of etch barrier composition 120 comprises at least one vinyl ether and 1) a PAG and optionally 2) a stabilizer, a release agent, or both a stabilizer and a release agent. At least one vinyl ether must contain silicon, germanium, tin, titanium or other Group IVA/IVB metal atoms.

The vinyl ether based etch barrier composition may include (1) between about 60% and about 99.8% by weight of at least one vinyl ether having at least two vinyl ether groups and at least about 6% by weight of at least one of silicon, germanium, tin and titanium or (2) between about 60% to about 99.8% by weight of at least one vinyl ether having at least two vinyl ether groups, less then about 40% by weight of at least one vinyl ether having one vinyl ether group and at least about 6% by weight of at least one of silicon, germanium, tin and titanium;

wherein the at least one vinyl ether having one vinyl ether group is represented by at least one of the following structures (II and III) and wherein the at least one vinyl ether having at least two vinyl ether groups is represented by at least one of the following structures (IV, V, VI and VII):

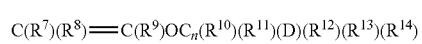 (II)

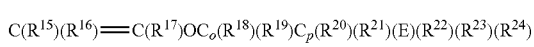 (III)

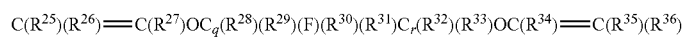 (IV)

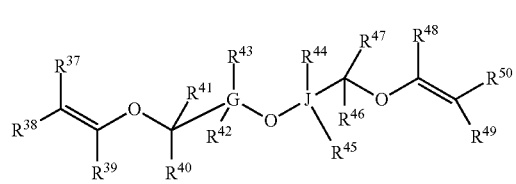 (V)

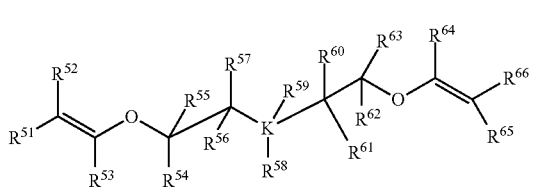 (VI)

(VII)

where each D, E, F, G, J, and K is independently selected from the group consisting of a carbon atom, a silicon atom, a germanium atom, a titanium atom and a tin atom;

where n, o, p, q, r, and s is independently selected from the group of integers consisting of 0, 1, 2, 3, 4, 5 and 6;

where each $R^7$, $R^8$, $R^9$, $R^{10}$, $R^{11}$, $R^{12}$, $R^{13}$, $R^{14}$, $R^{15}$, $R^{16}$, $R^{17}$, $R^{18}$, $R^{19}$, $R^{20}$, $R^{21}$, $R^{22}$, $R^{23}$, $R^{24}$, $R^{25}$, $R^{26}$, $R^{27}$, $R^{28}$, $R^{29}$, $R^{30}$, $R^{31}$, $R^{32}$, $R^{33}$, $R^{34}$, $R^{35}$, $R^{36}$, $R^{37}$, $R^{38}$, $R^{39}$, $R^{40}$, $R^{41}$, $R^{42}$, $R^{43}$, $R^{44}$, $R^{45}$, $R^{46}$, $R^{47}$, $R^{48}$, $R^{49}$, $R^{50}$, $R^{51}$, $R^{52}$, $R^{53}$, $R^{54}$, $R^{55}$, $R^{56}$, $R^{57}$, $R^{58}$, $R^{59}$, $R^{60}$, $R^{61}$, $R^{62}$, $R^{63}$, $R^{64}$, $R^{65}$, $R^{66}$, $R^{67}$, $R^{68}$, $R^{69}$, $R^{70}$, $R^{71}$, $R^{72}$, $R^{73}$, $R^{74}$, $R^{75}$ and $R^{76}$ ($R^7$ to $R^{76}$) is independently selected from the group consisting of a hydrogen atom and a hydrocarbyl substituent with a primary, a secondary or a tertiary carbon attachment point;

where the hydrocarbyl substituent is selected from the group consisting of a linear alkyl group having 1 to 6 carbon atoms, a linear alkoxy group having 1 to 6 carbon atoms, a branched alkyl having 2 to 12 carbon atoms, a branched alkoxy group having 2 to 12 carbon atoms, a cycloalkyl group having 3 to 17 carbon atoms, a bicycloalkyl group having 3 to 17 carbon atoms, a cycloalkoxy group having 3 to 17 carbon atoms, a bicycloalkoxy group having 3 to 17 carbon atoms, a fluorinated linear alkyl group having 2 to 12 carbon atoms, a fluorinated branched alkyl group having 2 to 12 carbon atoms, a fluorinated cycloalkyl group having 3 to 17 carbon atoms, an aryl group, an aralkyl group, an alkaryl group, an alkenyl group, an alkynyl, a cycloalkenyl group, a dihydropyranyl group, a dihydrofuranyl group, an alkalkenyl group, an alkenylalkyl group, an alkynyl group, an alkalkynyl group, an alkynylalkyl group, a trifluoromethyl group, a trifluoroethyl group, a trifluoropropyl group, a cyanopropyl group, a tris-trialkysily group, a tris-triarylsilyl group, a tris-trialkarylsilyl group, a tris-triaralkylsilyl group, a tris-trialkenylsilyl group, a tris-trifluoroalkyl group, a tris-trialkynylsilyl group, a tris-trifluoromethylsilyl group, a tris-trifluoroethylsilyl group, a tris-trifluoropropylsilyl group, and a tris-cyanopropylsilyl group, where the alkyl substituents in the tris-trialkylsilyl group include linear, branched, cyclic or bicyclic alkyl substituents having 1 to 21 carbon atoms, where the aryl substituents in the tris-triarylsilyl group include phenyl, naphthyl or phenanthryl, where the alkaryl substituents in the tris-trialkarylsilyl group include tolyl, where the aralkyl substituents in the tris-triaralkylsilyl group include benzyl, where the alkenyl substituents in the tris-trialkenylsilyl group include vinyl, where the fluoroalkyl substituents in the tris-trifluoroalkyl group include linear or branched fluorinated alkyl groups having 2 to 12 carbon atoms, or fluorinated cycloalkyl groups having 3 to 17 carbon atoms, and where the alkynyl substituents in the tris-trialkynylsilyl group include ethynyl groups; and where any two $R^7$-$R^{76}$ in the same molecule of the at least one vinyl ether (II, III, IV, V, VI or VII) may be linked to form a carbon ring having 3 to 8 carbon atoms.

Examples of suitable silicon containing vinyl ether based etch barrier materials include $CH_2$=$CHOCH_2Si(CH_3)_3$, $CH_2$=$CHOCH_2CH_2Si(CH_3)_3$, $CH_2$=$CHOCH_2Si(CH_3)_2CH_2OCH$=$CH_2$, $CH_2$=$CHOCH_2Si(CH_3)_2OSi(CH_3)_2CH_2OCH$=$CH_2$, $CH_2$=$CHOCH_2CH_2Si(CH_3)_2CH_2CH_2OCH$=$CH_2$, $CH(CH_3)$=$CHOCH_2Si(CH_3)(CH_2OCH$=$CH(CH_3))CH_2OCH$=$CH(CH_3)$, $CH_2$=$CHOCH_2CH_2Si(Si(CH_3)_3)_3$ and combinations thereof.

Etch barrier compositions that include vinyl ethers may be easily polymerized by traces of acid. The acid may be introduced into etch barrier composition by the optional PAG or from trace acid contamination from the vinyl ether itself.

Thus, the storage stability of the etch barrier or the non-metal containing coating composition having at least one vinyl ether may be a serious concern.

In one example, the optional stabilizer includes at least one of 9-anthracenemethanol, a substituted 9-anthracenementhanol having the structure (VIII), phenothiazine, a substituted phenothiazine having the structure (IX)

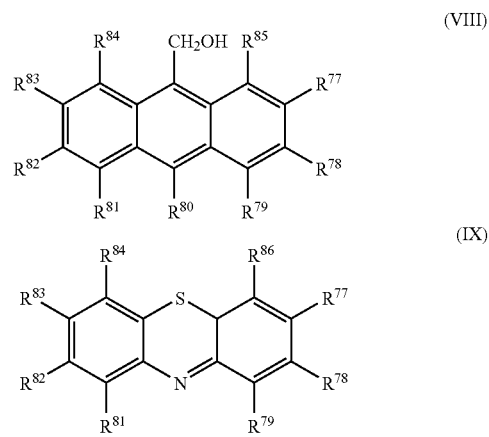

where each $R^{77}$, $R^{78}$, $R^{79}$, $R^{80}$, $R^{81}$, $R^{82}$, $R^{83}$, $R^{84}$, $R^{85}$ and $R^{86}$ ($R^{77}$-$R^{86}$) is independently selected from the group consisting of a hydrogen atom and a hydrocarbyl substituent with a primary, a secondary or a tertiary carbon attachment point, said hydrocarbyl group selected from the group consisting of an alkyl group having 1 to 20 carbon atoms, an alkenyl group having 1 to 20 carbon atoms, an alkynyl group having 1 to 20 carbon atoms, an aralkyl group having 1 to 20 carbon atoms, an alkaryl having 1 to 20 carbon atoms and an aryl group having 1 to 20 carbon atoms;

where, the alkyl groups of the aralkyl and the alkaryl groups may be linear, branched or cyclic and the aryl groups may include at least one carbon ring containing 3 to 8 carbon atoms; and where any two $R^{77}$-$R^{85}$ in the same molecule may be linked to form the at least one carbon ring containing 3 to 8 carbon atoms.

In one example, about 15% by weight of stabilizer (relative to the weight of any PAG in etch barrier composition) or less than about 0.75% by weight of stabilizer (relative to the weight of vinyl ethers in etch barrier composition) is added to the etch barrier composition.

The etch barrier composition advantageously includes a PAG. PAGs are compounds that generate an acid upon exposure to radiation and will cause cross-linking or enhance cross-linking of the polymer of the etch barrier layer. In one example between about 0.2 parts to about 10 parts of PAG is added to the etch barrier composition per 100 parts of etch barrier material. Examples of suitable PAGs include but are not limited to:

(1) sulfonium salts, examples of which include triphenylsulfonium perfluoromethanesulfonate (triphenylsulfonium triflate), triphenylsulfonium perfluorobutanesulfonate, triphenylsulfonium perfluoropentanesulfonate, triphenylsulfonium perfluorooctanesulfonate, triphenylsulfonium hexafluoroantimonate, triphenylsulfonium hexafluoroarsenate, triphenylsulfonium hexafluorophosphate, triphenylsulfonium bromide, triphenylsulfonium chloride, triphenylsulfonium iodide, 2,4,6-trimethylphenyldiphenylsulfonium perfluorobutanesulfonate, 2,4,6-trimethylphenyldiphenylsulfonium benzenesulfonate, tris(t-butylphenyl)sulfonium, diphenylethylsulfonium chloride, and phenacyldimethylsulfonium chloride;
(2) halonium salts, particularly iodonium salts, examples of which include diphenyliodonium perfluoromethanesulfonate (diphenyliodonium triflate), diphenyliodonium perfluorobutanesulfonate, diphenyliodonium perfluoropentanesulfonate, diphenyliodonium, diphenyliodonium hexafluoroantimonate, diphenyliodonium hexafluoroarsenate, bis-(t-butylphenyl)iodonium triflate, and bis-(t-butylphenyl)-iodonium camphorsulfonate;
(3) α,α'-bis-sulfonyl-diazomethanes, examples of which include bis(p-toluenesulfonyl)diazomethane, methylsulfonyl p-toluenesulfonyldiazomethane, 1-cyclohexylsulfonyl-1-(1,1-dimethylethylsulfonyl)diazomethane, and bis (cyclohexylsulfonyl)diazomethane;
(4) trifluoromethanesulfonate esters of imides and hydroxyimides, examples of which include (trifluoromethylsulfonyloxy)-bicyclo[2.2.1]hept-5-ene-2,3-dicarboximide (MDT);
(5) nitrobenzyl sulfonate esters, examples of which include as 2-nitrobenzyl p-toluenesulfonate, 2,6-dinitrobenzyl p-toluenesulfonate, and 2,4-dinitrobenzyl p-trifluoromethylbenzenesulfonate;
(6) sulfonyloxynaphthalimides, examples of which include N-camphorsulfonyloxynaphthalimide and Npentafluorophenylsulfonyloxynaphthalimide;
(7) pyrogallol derivatives (e.g., trimesylate of pyrogallol);
(8) naphthoquinone-4-diazides;
(9) alkyl disulfones;
(10) s-triazine derivatives; and
(11) miscellaneous sulfonic acid generators including t-butylphenyl-α-(p-toluenesulfonyloxy)-acetate, t-butyl-α-(p-toluenesulfonyloxy)acetate, and N-hydroxy-naphthalimide dodecane sulfonate (DDSN), and benzoin tosylate.

Examples of PAGs advantageously soluble in etch barrier compositions based on the vinyl ether structures II, III, IV, V, VI, VII and VIII, are represented by structures represented by the following structure X, XI and XII:

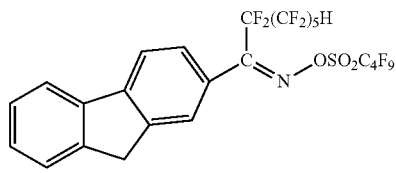
(X)

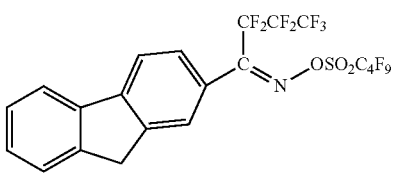
(XI)

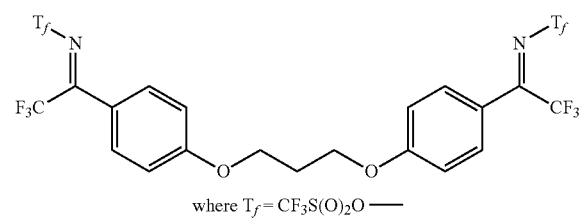
(XII)

where $T_f = CF_3S(O)_2O—$

Structure (XII) is sensitive to 313 nm (UV) radiation and is insensitive to i-line (365 nm UV radiation). However, addition of about 15% by weight (relative to the weight of PAG) of 9-anthracenemethanol or phenothiazene renders structure (XII) sensitive to 365 nm radiation. Structures (X) and (XI) are sensitive to both 313 nm and 365 nm radiation.

In order to facilitate release of the exposed etch barrier layer from the template (as described infra), materials with a low surface energy such as fluorinated vinyl ethers can be optionally included in the etch barrier composition. An example of a fluorinated vinyl ether is vinyl 2,2,2-trifluoroethyl ether.

Figure 1C:
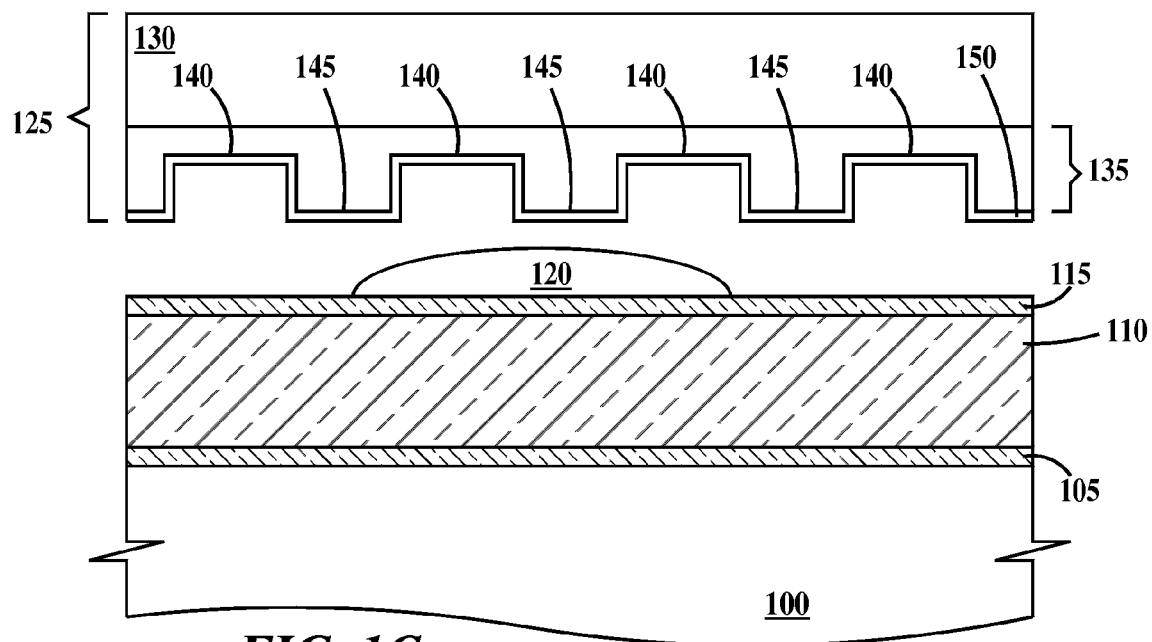

In FIG. 1C, a template 125 is aligned to substrate 100. Template 125 includes a support portion 130 and a mold portion 135. Both support 130 portion and mold portion 135 are transparent to the wavelength of radiation that etch barrier composition 120 is sensitive to (in one example 313 nm and/or 365 nm). Mold portion 135 includes a relief pattern made up of trenches (or grooves) 140 and plateaus (or lands) 145. An optional release layer 150 may be applied to the bottom and sidewalls of trenches 140 and plateaus 145. Alternatively template 125 may be monolithic and support portion 130 and mold portion 135 integral with each other.

Figure 1D:
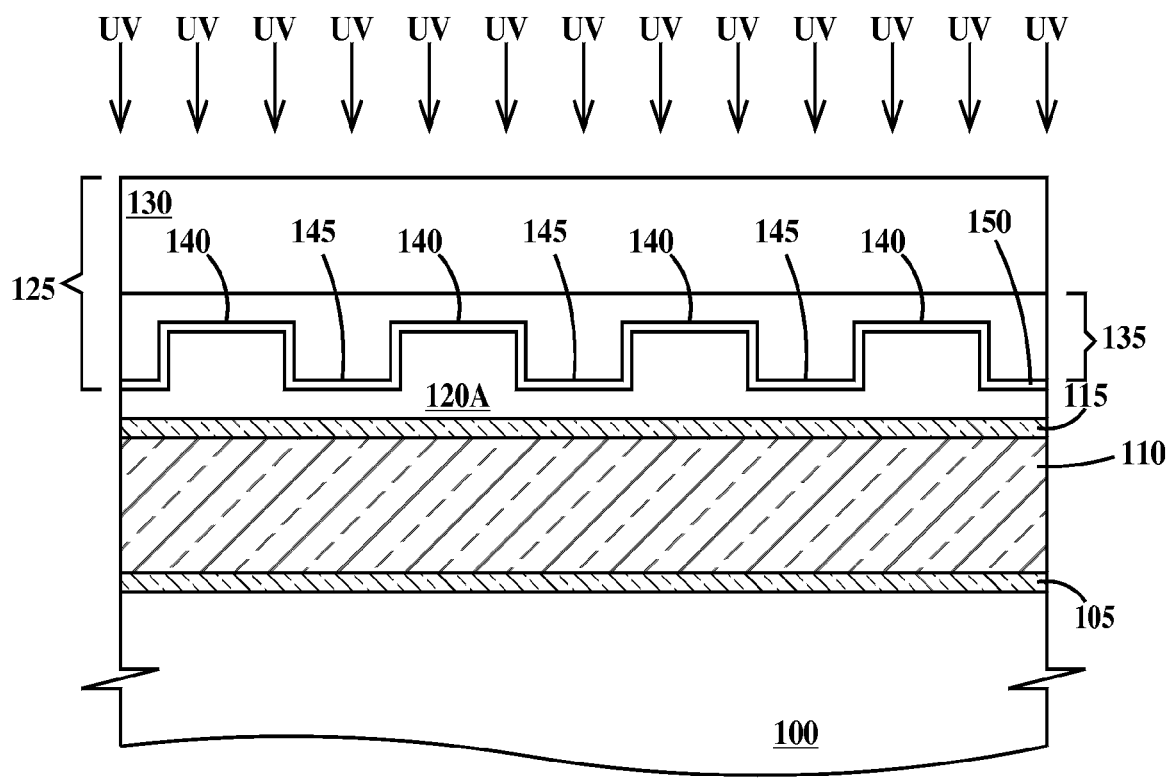

In FIG. 1D, template 125 is pressed with a low pressure (i.e., less than about 1 psi) toward substrate 100, and the puddle of etch barrier composition 120 (see FIG. 1C) is spread out over second adhesion layer 115 (or transfer layer 110, if the second adhesion layer is not used), completely filling trenches 140 between plateaus 145 and forming an uncured etch barrier layer 120A. Plateaus 145 do not touch second adhesion layer 115 (or transfer layer 110, if the second adhesion layer is not used) so etch barrier layer 120A is a continuous layer having thick and thin regions. After exposure to actinic radiation (in this case UV light) and removal of template 125, uncured etch barrier layer 120A is converted to a cured (i.e. cross-linked) etch barrier layer 120B as depicted in FIG. 1E.

Figure 1E:
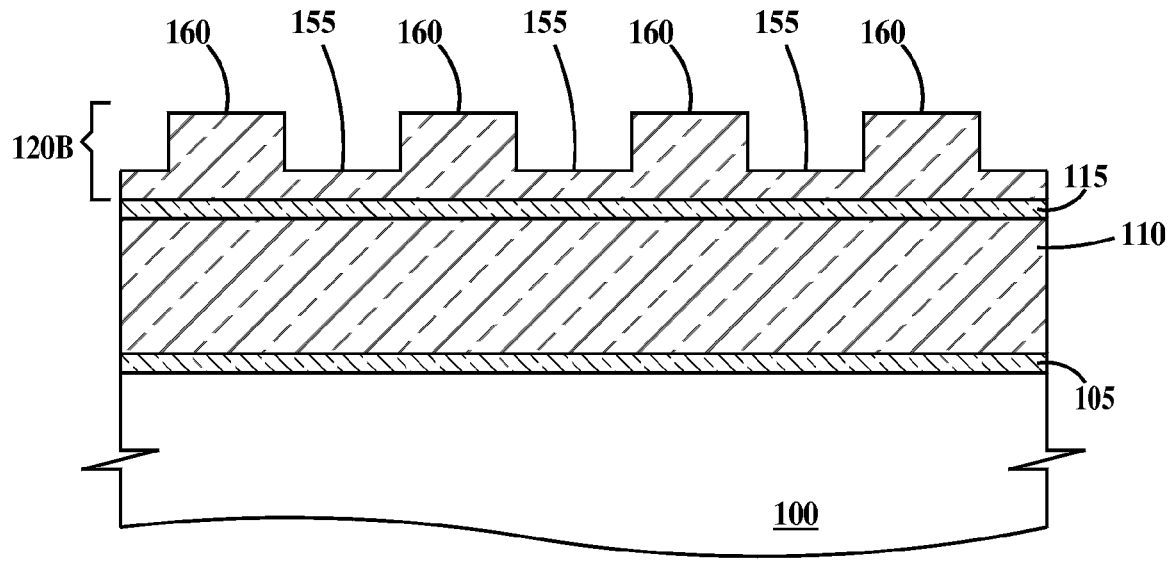

In FIG. 1E, cured etch barrier layer comprises thin regions 155 and thick regions 160. When transfer layer 110 comprises PVBA, second adhesion layer 115 comprises a material having a triethoxysiyl moiety, and cured etch barrier layer 120B is a vinyl ether based polymer, the triethoxysiyl moiety reacts with the carboxylic acid group of PVBA of the transfer layer and the vinyl ether group of the vinyl either polymer of the etch barrier layer to covalently bond the transfer layer to the etch barrier layer.

Figure 1F:
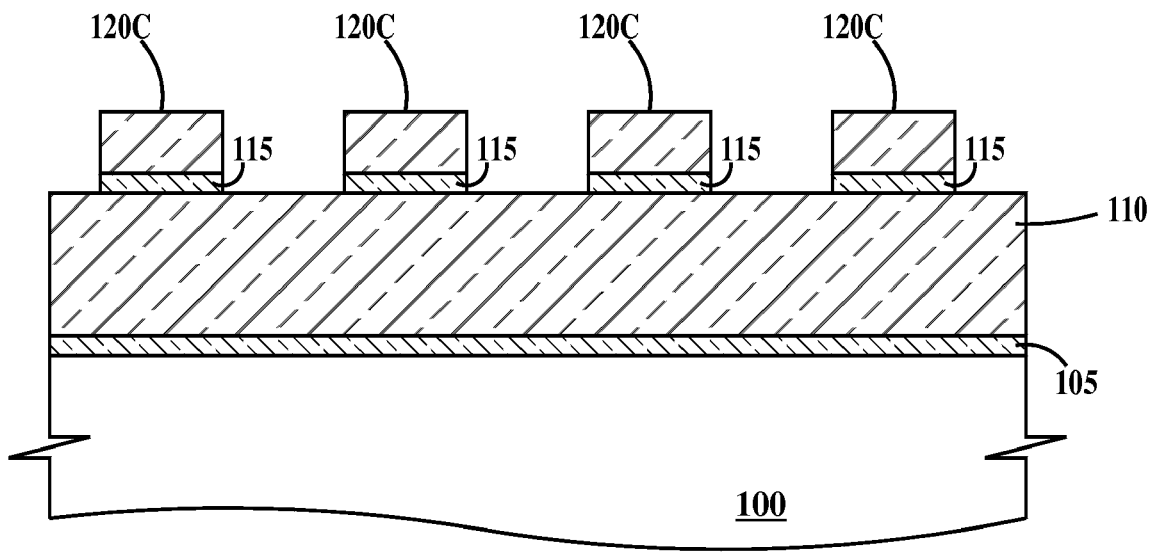

In FIG. 1F, cured etch barrier layer 120B (see FIG. 1E) is subjected to a first fluorocarbon RIE to remove the thin regions 155 of cured etch barrier layer 120B (see FIG. 1E) and reduce the thickness of thick regions 160 of cured etch barrier layer 120B (see FIG. 1E), leaving cured etch barrier islands 120C. First fluorocarbon RIE is also known as a breakthrough etch. Any second adhesion layer 115 not under thick regions 160 of cured etch barrier layer 120B (see FIG. 1E) is also removed by the fluorocarbon RIE process.

Figure 1G:
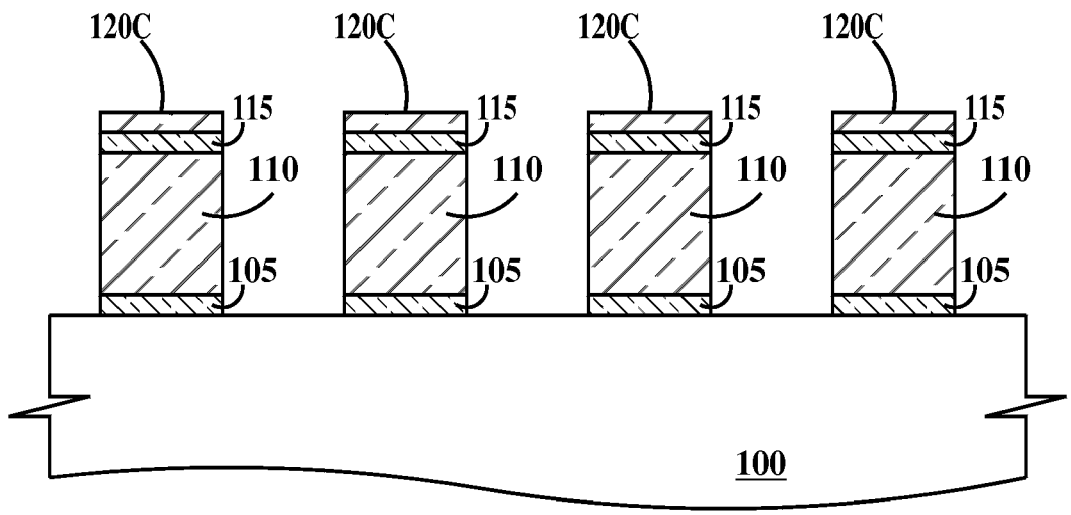

In FIG. 1G, an oxygen RIE process is performed removing transfer layer 110 and first adhesion layer 105 not protected by cured etch barrier islands 120C and thus exposing the top surface of substrate 100. Cured etch barrier islands 120C may be further thinned by the oxygen RIE process as illustrated, or alternatively may be removed by the oxygen RIE process.

Figure 1H:
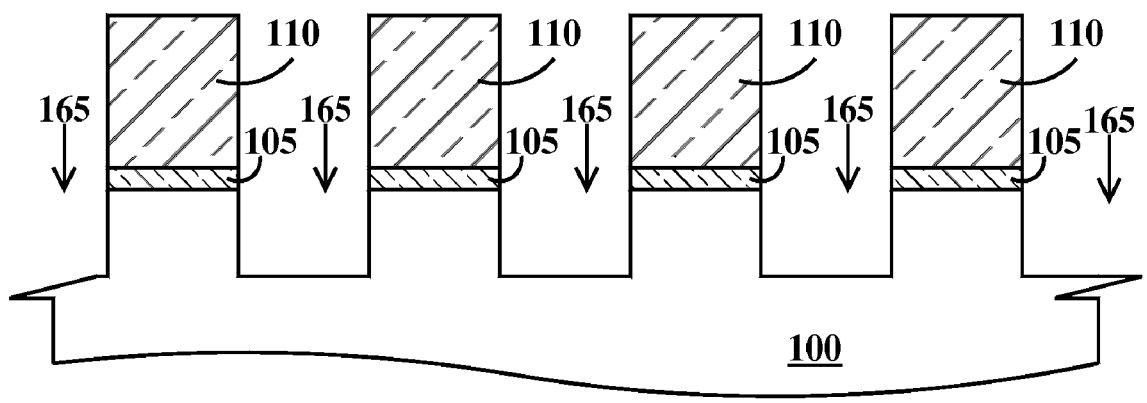

In FIG. 1H, a second fluorocarbon RIE is performed to etch trenches 165 into substrate 100 wherever substrate 100 is not protected by transfer layer 110. Any remnants of cured etch barrier islands 120C (see FIG. 1G) not removed by the oxygen RIE of FIG. 1G, are removed by the second fluorocarbon RIE.

Figure 1I:
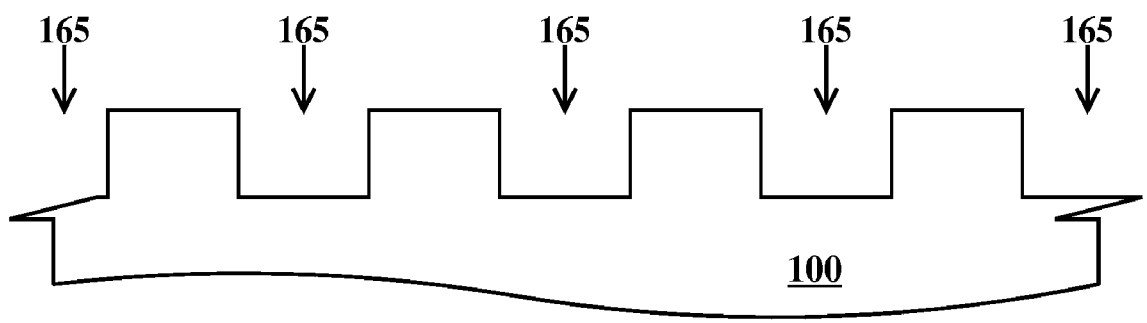

In FIG. 1I, the remaining transfer layer 110 and first adhesion layer 105 (see FIG. 1H) are removed using organic solvents such as 2-ethoxyethanol, 2-methoxyethanol, 1-methoxy-2-propanol, N-methylpyrrolidone or an aqueous base when transfer layer 110 is PVBA. When transfer layer 110 comprises a thermosetting polymer, a thermoplastic polymer, a polyepoxy polymer, a polyamide polymer, a polyimide polymer, a polyurethane polymer, a polycarbonate polymer or a polyester polymer, then plasma or acid removal processes are required.

Thus, the pattern of plateaus 145 of template 125 (see FIG. 1C) have been converted to trenches 165 in substrate 100 (see FIG. 1I) in a negative imaging process in the first embodiment of the present invention.

Figure 2A:
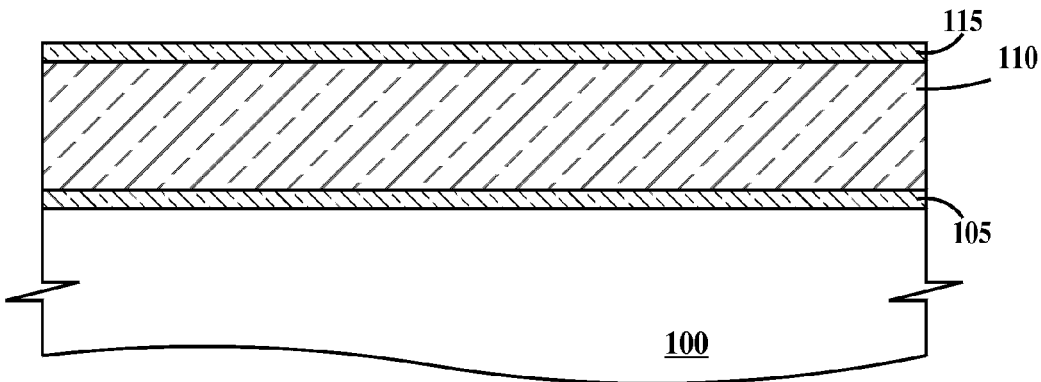
FIGS. 2A through 2L are cross-sectional drawings illustrating a SFIL process according to a second embodiment of the present invention.
Figure 2B:
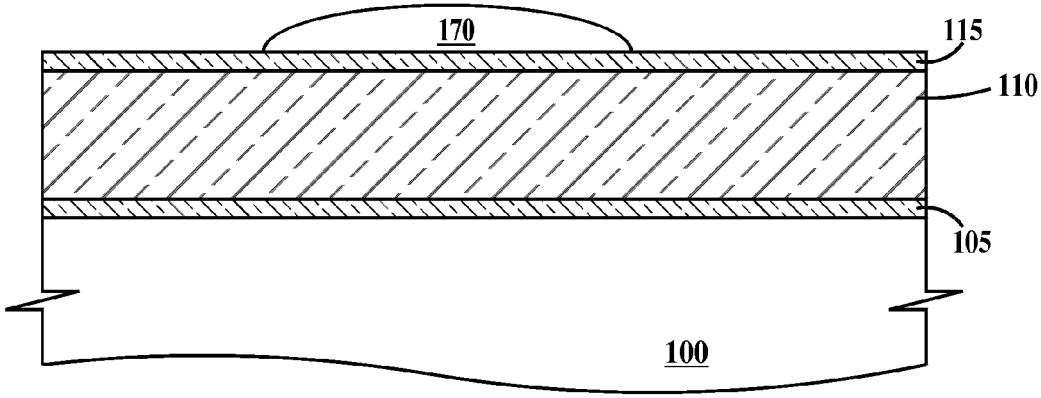

FIGS. 2A through 2L are cross-sectional drawings illustrating a SFIL process according to a second embodiment of the present invention. FIG. 2A is the same as FIG. 1A. FIG. 2B is similar to FIG. 1B, except puddle of etch barrier composition 120 (see FIG. 1B) is replaced with a puddle of molding composition 170. The material of puddle of molding composition of 170 is similar to the material of the puddle etch composition described supra, except the material of puddle of molding composition 170 includes no silicon, germanium, tin, titanium or other Group IVA/IVB metal atoms.

In a one example, the material of the puddle of molding composition 170 comprises at least one vinyl ether and 1) a PAG and optionally 2) a stabilizer, a release agent, or both a stabilizer and a release agent.

The vinyl ether based molding composition may include (1) between about 60% and about 99.8% by weight of at least one vinyl ether having at least two vinyl ether groups or (2) between about 60% to about 99.8% by weight of at least one vinyl ether having at least two vinyl ether groups and less then about 40% by weight of at least one vinyl ether having one vinyl ether group;

wherein the at least one vinyl ether having one vinyl ether group is represented by at least one of the following structures (XIII and XIV) and wherein the at least one vinyl ether having at least two vinyl ether groups is represented by at least one of the following structures (XV, XVI, XVII and XVIII):

$R^{138}, R^{139}, R^{140}, R^{141}, R^{142}, R^{143}, R^{144}, R^{145}, R^{146}, R^{147}, R^{148}, R^{149}, R^{150}, R^{151}, R^{152}, R^{153}, R^{154}$ and $R^{155}$ ($R^{87}$ to $R^{155}$) is independently selected from the group consisting of a hydrogen atom, a fluorine atom and a hydrocarbyl substituent with at least one of a primary, secondary and a tertiary carbon attachment point, where the hydrocarbyl substituent is selected from the group consisting of a linear alkyl or a linear alkoxy group having 1 to 6 carbon atoms, a branched alkyl or branched alkoxy group having 2 to 12 carbon atoms, a cycloalkyl, a bicycloalkyl, a cycloalkoxy or a bicycloalkoxy group having 3 to 17 carbon atoms, a fluorinated linear alkyl group having 2 to 12 carbon atoms, a fluorinated branched alkyl group having 2 to 12 carbon atoms, a fluorinated cycloalkyl group having 3 to 17 carbon atoms, an aryl group, an aralkyl group, an alkaryl group, an alkenyl group, an alkynyl, a cycloalkenyl group, a dihydropyranyl group, a dihydrofuranyl group, an alkalkenyl group, an alkenylalkyl group, an alkynyl group, an alkalkynyl group, an alkynylalkyl group, a trifluoromethyl group, a trifluoroethyl group, a trifluoropropyl group, a cyanopropyl group and where the fluoroalkyl substituents in the tris-trifluoroalkyl group include linear or branched fluorinated alkyl groups having 2 to 12 carbon atoms, or fluorinated cycloalkyl groups having 3 to 17 carbon atoms.

Examples of suitable non-silicon containing vinyl ether molding composition materials include $CH_2$=$CHOCH_2C(CH_3)_3$, $CH_2$=$CHOCH_2CH_2C(CH_3)_3$, $CH_2$=$CHOCH_2C(CH_3)_2CH_2OCH$=$CH_2$, $CH_2$=$CHOCH_2C(CH_3)_2OC(CH_3)_2CH_2OCH$=$CH_2$, $CH_2$=$CHOCH_2CH_2C(CH_3)_2CH_2CH_2OCH$=$CH_2$, $CH_2$=$CHOCH_2CH_2C(CH_3)_2CH_2OCH$=$CH_2$, $CH(CH_3)$=$CHOCH_2C(CH_3)(CH_2OCH$=$CH(CH_3))CH_2OCH$=$CH(CH_3)$, $CH_2$=$CHOCH_2CH_2C(C(CH_3)_3)_3$ and combinations thereof.

The material of the molding composition includes PAGs (examples 1 through 11 and structures X, XI and XII) and may also include the stabilizer (structures VII and IX) and/or one or more release agents such as vinyl 2,2,2-trifluoroethyl ether.

Figure 2C:
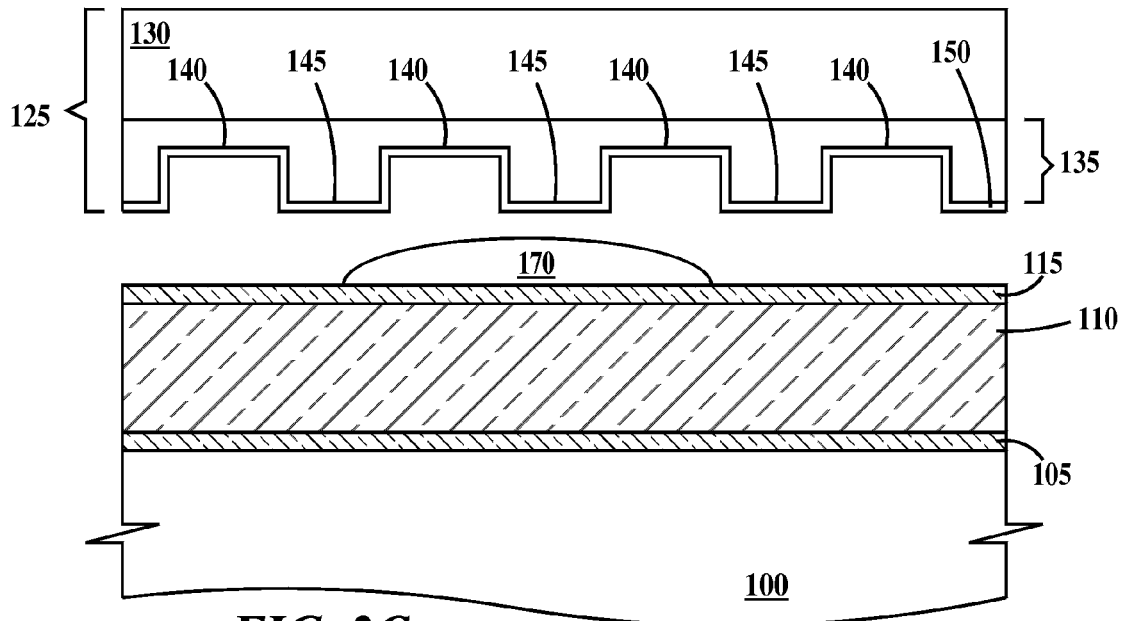

FIG. 2C is similar to FIG. 1C, except puddle of etch barrier composition 120 (see FIG. 1C) is replaced with a puddle of molding composition 170.

(XIII)

(XIV)

(XV)

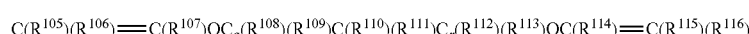

(XVI)

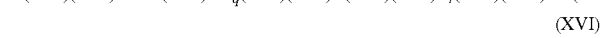

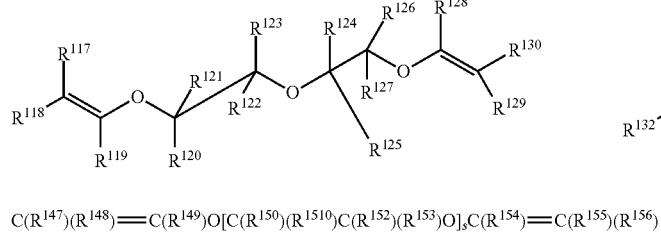

(XVII)

(XVIII)

Figure 2D:
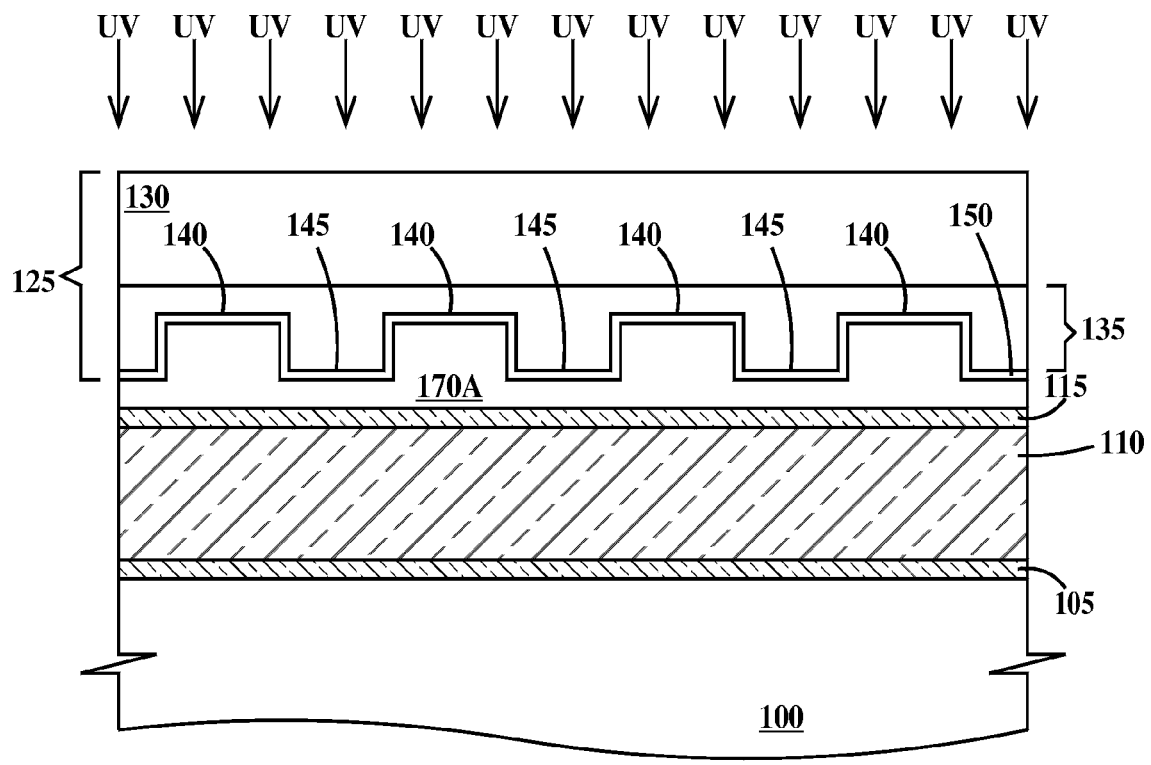

$C(R^{147})(R^{148})$=$C(R^{149})O[C(R^{150})(R^{151})C(R^{152})(R^{153})O]_sC(R^{154})$=$C(R^{155})(R^{156})$ where n, o, p, q, r and s are independently selected from the group consisting of the integers 0, 1, 2, 3, 4, 5, and 6; and where each $R^{87}, R^{88}, R^{89}, R^{90}, R^{91}, R^{92}, R^{93}, R^{94}, R^{95}, R^{96}, R^{97}, R^{98}, R^{99}, R^{100}, R^{101}, R^{102}, R^{103}, R^{104}, R^{105}, R^{106}, R^{107}, R^{108}, R^{109}, R^{110}, R^{111}, R^{112}, R^{113}, R^{114}, R^{115}, R^{116}, R^{117}, R^{118}, R^{119}, R^{120}, R^{121}, R^{122}, R^{123}, R^{124}, R^{125}, R^{126}, R^{127}, R^{128}, R^{129}, R^{130}, R^{131}, R^{132}, R^{133}, R^{134}, R^{135}, R^{136}, R^{137}$, In FIG. 2D, template 125 is pressed with a low pressure (i.e., less than about 1 psi) toward substrate 100, and the puddle of molding composition 170 (see FIG. 2C) is spread out over second adhesion layer 115 (or transfer layer 110, if the second adhesion layer is not used), completely filling trenches 140 between plateaus 145 and forming an uncured molding layer 170A. Plateaus 145 do not touch second adhesion layer 115 (or transfer layer 110, if the second adhesion layer is not used) so molding layer 170A is a continuous layer having thick and thin regions. After exposure to actinic radiation (in this case UV light) and removal of template 125, uncured molding layer 170A is converted to a cured (i.e. cross-linked) molding layer 170B as depicted in FIG. 2E.

Figure 2E:
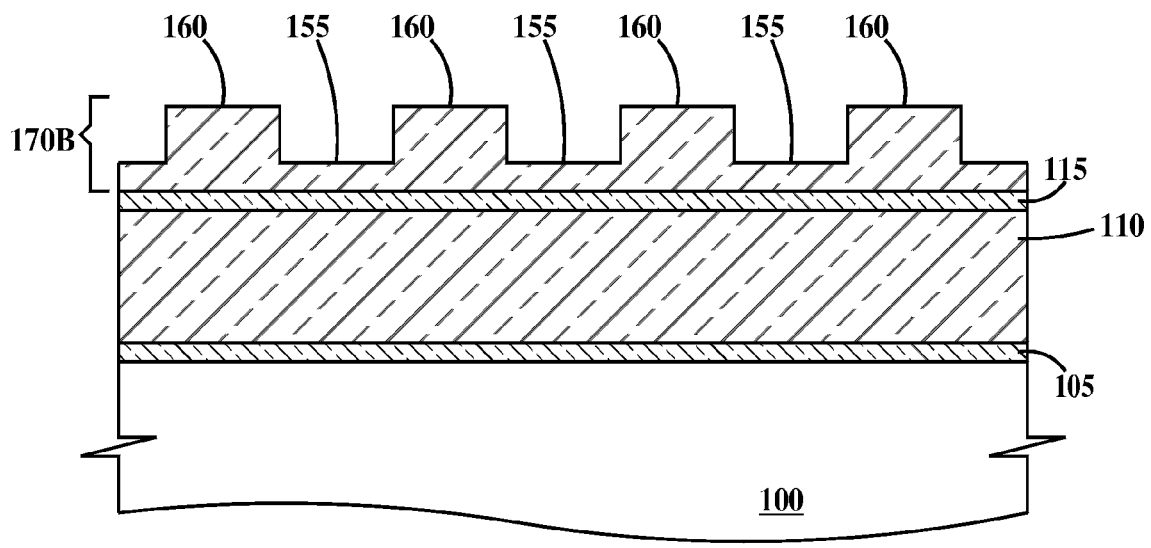

In FIG. 2E, cured molding layer comprises thin regions 155 and thick regions 160. When transfer layer 110 comprises PVBA, second adhesion layer 115 comprises a material having a triethoxysiyl moiety and cured molding layer 170B is a vinyl ether based polymer, the triethoxysiyl moiety reacts with the carboxylic acid group of PVBA of the transfer layer and the vinyl ether group of the vinyl either polymer of the molding layer to covalently bond the transfer layer to the molding layer.

Figure 2F:
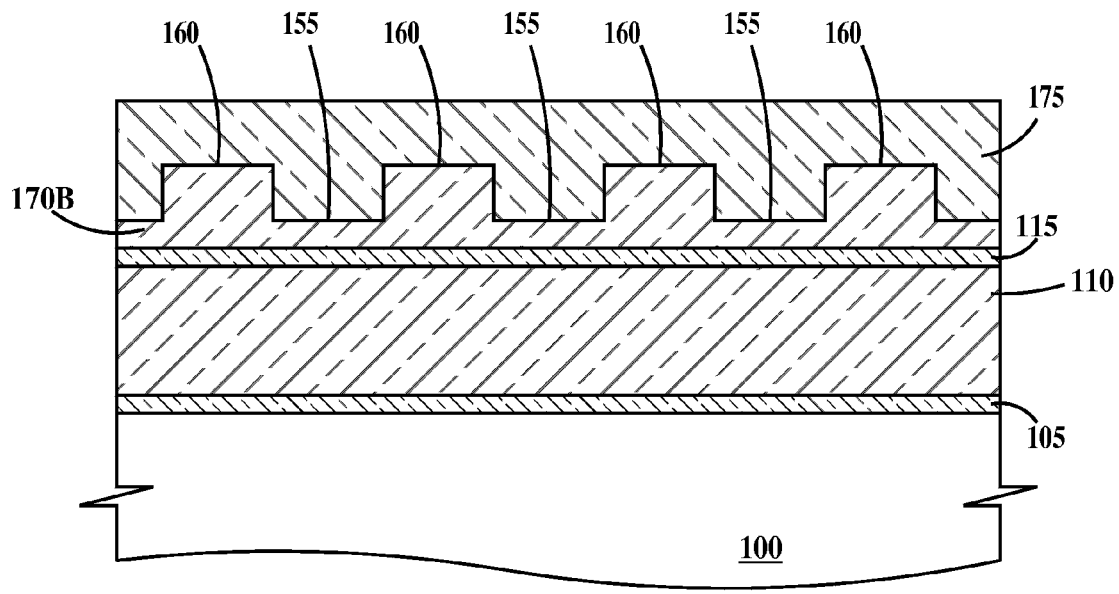

In FIG. 2F, a backfill layer 175 is formed over cured molding layer 170B, completing filling the space between thick regions 160 and covering both thin regions 155 and thick regions 160.

In one example, the material of backfill layer 175 is the same as the etch barrier composition of puddle of etch barrier composition 120 (see FIG. 1B) described supra, i.e structures II, III, IV, VI and VII and PAG (examples 1 through 11 and structures X, XI and XII) and may include one or more of the stabilizer (structures VII and IX) and release agents vinyl 2,2,2-trifluoroethyl ether and structure II.

In a second example, backfill layer 175 may comprise a siloxane polymers, spin-on-glass or organo silicate glass (OSG) materials including silsesquioxane resins (low molecular weight polymers or oligomers) which may be represented by the formulas —(SiO$_2$)n-, a —(R'SiO$_{3/2}$)n-, —(R'$_2$SiO)n- and —(R"Si$_2$O$_3$)n-, where R' is selected from the group consisting of an alkyl group having 1 to 3 carbon atoms, an aryl group having 6 to 12 carbon atoms, and a cycloalkyl group having 6 to 12 carbon atoms, and wherein R" is selected from the group consisting of an alkylene group having 1 to 2 carbon atoms and a cycloalkylene group having 6 to 12 carbon atoms.

In a third example, backfill layer 175 may comprise any polymer containing at least 6 percent by weight of a metal such as silicon, germanium, tin, titanium or other Group IVA/IVB metals.

Figure 2G:
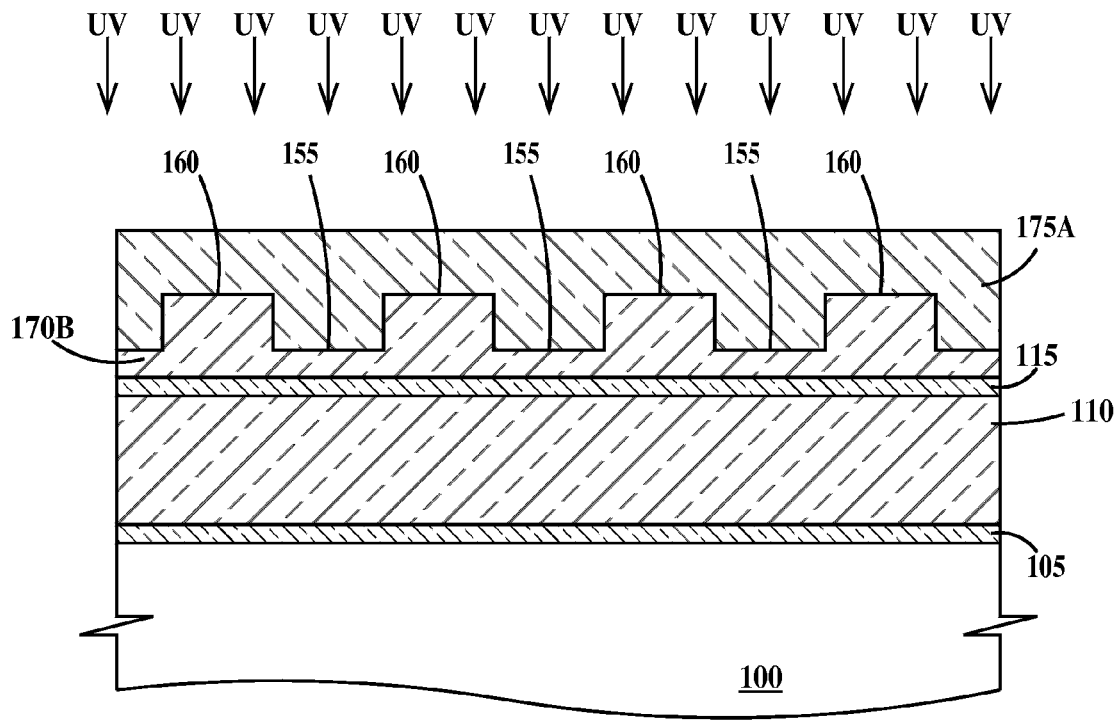

In FIG. 2G, an optional exposure to actinic radiation is performed (in this case UV light) and backfill layer 175 (see FIG. 2F) is converted to a cured (i.e. cross-linked) backfill layer 175A. Again, curing of backfill layer 175 (see FIG. 2F) is optional.

Figure 2H:
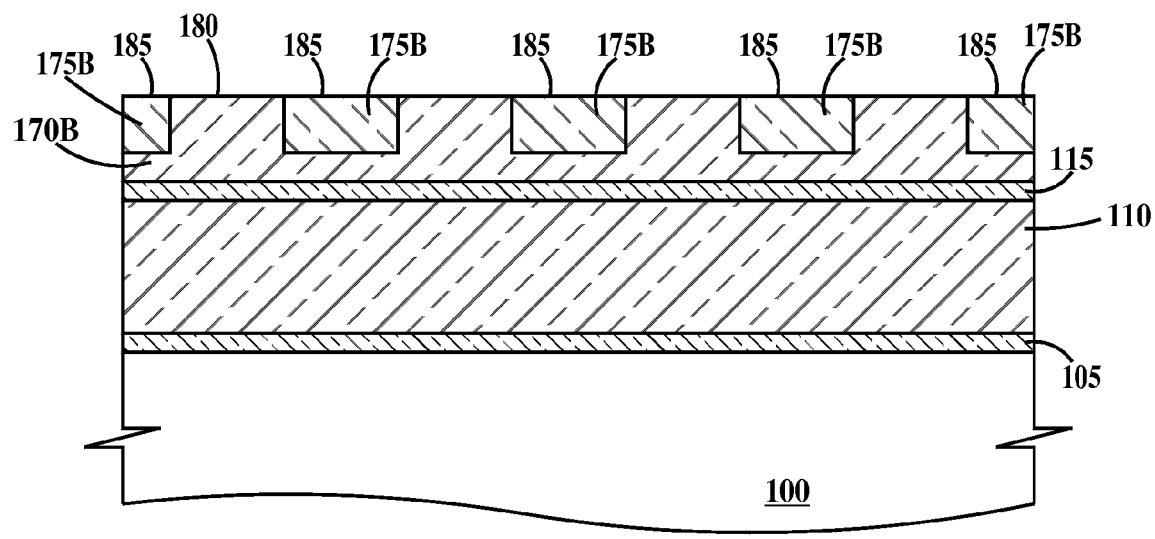

In FIG. 2H, cured backfill layer 175A (see FIG. 2G) or uncured backfill layer 175 (see FIG. 2F) is thinned and planarized to form etch barrier islands 175B of cured or uncured backfill material and expose cured molding layer 170B between the etch barrier islands. A top surface 180 of cured molding layer 170B is coplanar with top surfaces 185 of etch barrier islands 175B or top surface 180 may be recessed below tops surfaces 185. In one example, if etch barrier islands 175B are formed from cured etch barrier material, then the thinning and planarizing may be accomplished by either CMP or RIE. In one example, if etch barrier islands 175B are formed from uncured etch barrier material, then the thinning and planarizing may be accomplished by RIE.

Figure 2I:
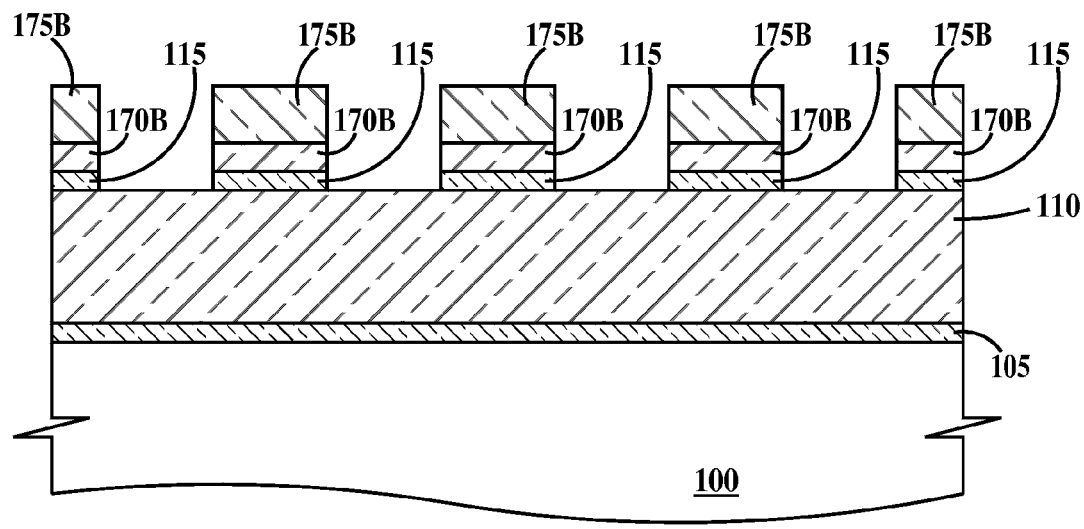

In FIG. 2I, a first oxygen RIE is performed to remove cured molding layer 170B and second adhesion layer 115 from between etch barrier islands 175B, exposing the top surface of transfer layer 110.

Figure 2J:
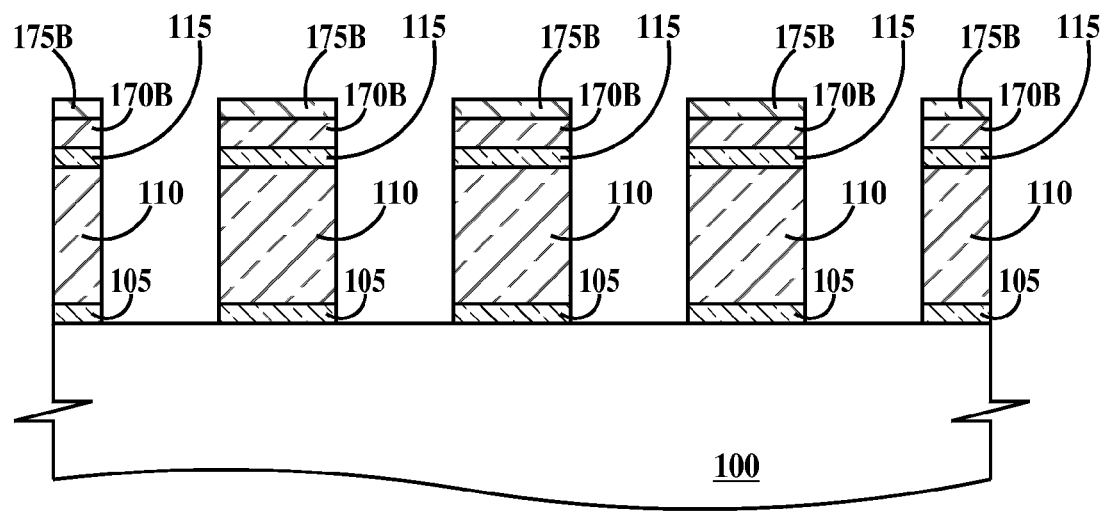

In FIG. 2J, an second oxygen RIE process is performed removing transfer layer 110 and first adhesion layer 105 not protected by etch barrier islands 175B and thus exposing the top surface of substrate 100. Etch barrier islands 175B may be thinned by the oxygen RIE process as illustrated.

Alternatively, the first and second oxygen RIE of FIGS. 2I and 2J may be combined into a single oxygen RIE process.

Figure 2K:
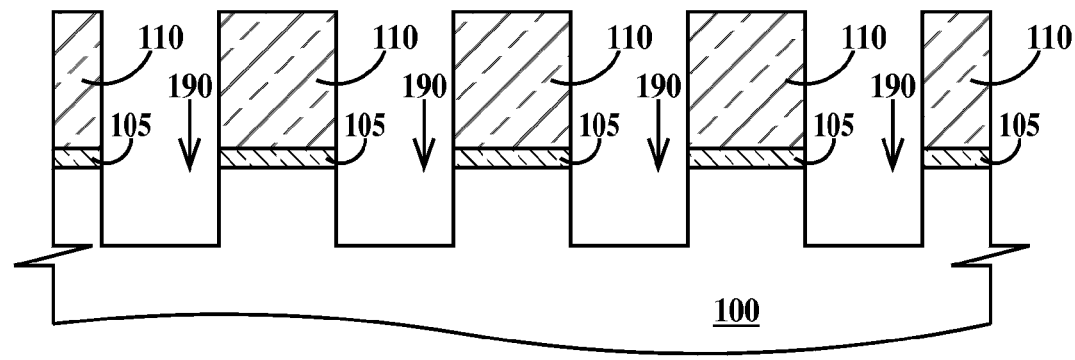

In FIG. 2K, a fluorocarbon RIE is performed to etch trenches 190 into substrate 100 wherever substrate 100 is not protected by transfer layer 110. Any remnants of etch barrier islands 175B (see FIG. 2J) not removed by the oxygen RIE of FIG. 2J, are removed by the second fluorocarbon RIE.

Figure 2L:
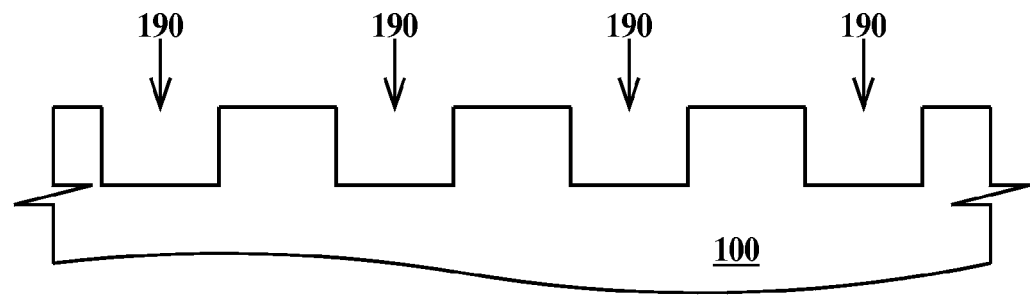

In FIG. 2L, the remaining transfer layer 110 (see FIG. 2K) are removed using solvents such as 2-ethoxyethanol, 2-methoxyethanol, 1-methoxy-2-propanol, N-methylpyrrolidone, or an aqueous base when transfer layer 110 is PVBA. When transfer layer 110 comprises a thermosetting polymer, a thermoplastic polymer, a polyepoxy polymer, a polyamide polymer, a polyimide polymer, a polyurethane polymer, a polycarbonate polymer or a polyester polymer, then plasma or acid removal processes are required. When optional first adhesion layer 105 (see FIG. 2K) is used then plasma or acid removal processes may be required.

Thus, the pattern of trenches 140 of template 125 (see FIG. 2C) have been converted to trenches 190 in substrate 100 (see FIG. 2L) in a positive imaging process in the second embodiment of the present invention.

EXPERIMENTAL RESULTS

The etch experiment results summarized in the Table I, infra, indicate that the cured silicon-containing vinyl ether etch barrier layers etch at a much slower rates than layers of organic polymers such as poly(vinylbenzoic acid) in an oxygen RIE. Thus, a cured vinyl ether etch barrier layer having at least 6 percent by weight of a metal such as silicon, germanium, tin, titanium or other Group IVA/IVB metals, can function as an etch barrier to prevent the transfer layer of an SFIL process (or any layer under etch barrier layer) from being etched in an oxygen RIE. As described supra, the transfer layer is an organic polymer that etches rapidly in an oxygen RIE and slowly in fluorocarbon RIE.

TABLE I

| Etched Materials | Si % | RIE | Etch rate (nm/sec) |
| --- | --- | --- | --- |
| 100% tri(ethylene glycol) divinyl ether | 0 | O$_2$ | 7-9.5 |
| 50% tri(ethylene glycol) divinyl ether + 50% bis(divinyloxymethyl)dimethylsilane | 8.2 | O$_2$ | 0.6-0.9 |
| 80% bis(divinyloxymethyl)dimethylsilane + 20% trifluoroethyl vinyl ether | 13 | O$_2$ | 0.13-0.2 |
| Poly(4-vinylbenzoic acid) | 0 | O$_2$ | 5.1 |
| Poly(4-vinylbenzoic acid) | 0 | CF$_4$ | 1.3 |

Imaging Experiment 1 p-Tollyldiphenylsulfonium triflate (0.5014 gram) was dissolved in 9.9949 grams of di(ethylene glycol) divinyl ether (Aldrich), to which was added 0.0751 grams of 9-anthracenemethanol. Silicon wafers were treated with O-vinyloxybutyl-N-(triethoxysilylpropyl)urethane (0.2014 gram) in 10.1213 grams of xylene at 90° C. for 1 hr and rinsed with hexane. A drop of the vinyl ether formulation thus prepared was applied to the silicon wafer using a thin layer chromatography (TLC) capillary tube. A template made of cross-linked methacrylate was placed on the liquid at a very low pressure of 1 N/m$^2$ (Pascal) and a UV light (greater than about 300 nm) was shined for 15 seconds through the template onto the vinyl ether formulation. The stack was placed in soap-water and the template detached. Atomic force microscopic (AFM) examination of the cured layer exhibited a faithful replica of the template (100 nm equal line/space patterns).

Imaging Experiment 2

The experiment of imaging example 1 was repeated, except tri(ethylene glycol) divinyl ether was substituted for di(ethylene glycol) divinyl ether. Again, AFM examination of the cured layer exhibited a faithful replica of the template (100 nm equal line/space patterns).

Imaging Experiment 3

A 1:1 mixture of tri(ethylene glycol) divinyl ether (1.0206 grams) and dimethyl-bis(vinyloxymethyl)silane (1.0036 grams) containing 0.0512 gram of p-tollyldiphenylsulfonium triflate and 0.0079 gram of 9-anthracenemethanol was placed on a silicon wafer coated with the adhesion promoter of Example 1 using a TLC capillary tube. Imprint was performed and replicated patterns examined as described in examples 1-2, but with an exposure times of 5 and 30 seconds (versus 15 seconds) and a higher template pressure of 5 N/m$^2$ (Pascal). Again, AFM examination of the cured layer exhibited a faithful replica of the template (100 nm equal line/space patterns). Again, AFM examination of the cured layer exhibited a faithful replica of the template (100 nm equal line/space patterns).

Adhesion Experiment 1

A silicon wafer was coated with poly(p-vinylbenzoic acid) (Mn=9,200, PDI=1.28) and baked at 150° C. for 60 seconds. An adhesion promotion layer was applied on the poly(vinylbenzoic acid) film by spinning O-vinyloxybutyl-N-(triethoxysilylpropyl)urethane at 1000 rpm for 30 seconds and then at 3000 rpm for 30 seconds followed by rinsing with hexane. The application of the adhesion promoter increased a water contact angle of the transfer layer surface from 43 degrees to 69 degrees. A mixture of dimethyl-bis(vinyloxymethyl)silane (0.8215 gram) and trifluoroethyl vinyl ether (0.2521 gram) containing 0.0214 gram of the PAG material of structure XII was dispensed on the coated silicon wafer and a quartz wafer was placed on top of it and the liquid was uniformly spread between the quartz and the transfer layer on the bottom silicon wafer. The vinyl ether layer was exposed to unfiltered UV light for 10 sec through the quartz wafer. The stack was placed in soap-water and pried open by inserting a razor blade between the quartz and silicon wafers. The quartz disc was cleanly released without losing adhesion between the etch barrier and transfer layers and between the transfer layer and silicon wafer. Secondary ion mass spectroscopy (SIMS) examinations of the stack of layers on silicon indicated that fluorine was enriched in the interface between the etch barrier layer and quartz.

Adhesion Experiment 2

Adhesion release experiment 1 was repeated, but excluding trifluoroethyl vinyl ether. In this case, the release occurred between the transfer layer and silicon wafer, with the cured etch barrier layer remaining attached to the quartz wafer.

Adhesion release experiments 1 and 2 illustrate that addition of fluorinated vinyl ether helps release of the template from the cured etch barrier layer, since absence of the fluorinated vinyl ether results in adhesive failure between the substrate and the transfer layer.

Adhesion Experiment 3

Poly(p-vinylbenzoic acid) made with BPO was dissolved in 2-methoxyethanol, spin-cast on a silicon wafer, and baked at 150° C. for 60 seconds. Adhesion promoter O-(vinyloxybutyl)-H-(triethoxysilylpropyl)-urethane was spun on the polymer film and rinsed with hexane. The surfaces of the poly(vinylbenzoic acid) films with and without the adhesion promoter treatment were subjected to x-ray photoelectron spectroscopy (XPS) analysis. The treated surface had nitrogen (from the promoter) but the untreated surface did not.

Thus, the embodiments of the present invention provide SFIL processes having one or more of longer shelf life of the molding material, improved stripability of the transfer layer, improved image size control, improved layer interface adhesion and improved template release compared to current SFIL methods.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method of forming an image, comprising:
forming on a substrate, a transfer layer of a transfer composition;
forming on said transfer layer, an etch barrier layer of an etch barrier composition;
pressing a surface of a template into said etch barrier layer, said a template having a relief pattern on said surface, said etch barrier layer filling voids in said relief pattern, said template not contacting said transfer layer;
exposing said etch barrier layer to actinic radiation, said actinic radiation converting said etch barrier layer to a cured etch barrier layer having thick and thin regions corresponding to said relief pattern;
removing said template;
removing said thin regions of said cured etch barrier layer;
removing regions of said transfer layer not protected by said etch barrier layer;
removing regions of said substrate not protected by said transfer layer and removing any remaining etch barrier layer; and
removing any remaining transfer layer by dissolving said remaining transfer layer in at least one of an aqueous base and an organic solvent.

2. The method of claim 1, wherein said transfer layer composition comprises poly(vinylbenzoic acid).

3. The method of claim 1, further including:
forming an adhesion layer between said substrate and said transfer layer.

4. The method of claim 1, further including:
forming an adhesion layer between said transfer layer and said etch barrier layer.

5. The method of claim 4, wherein said adhesion layer comprises:

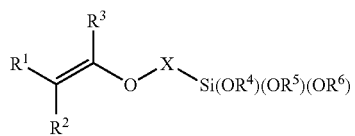

where X is a linking group selected from the group consisting of —C(O)O—, —C(O)—, —OC(O)—, —O—C(O)—C(O)—O—, NHC(O)—O—, —O—C(O)—O—, a linear or a branched alkylene having 1 to 7 carbon atoms, a cycloalkylene having 3 to 17 carbon atoms, an alkylcycloalkylene having 4 to 20 carbon atoms and a cycloalkylalkylene having 4 to 20 carbon atoms;

where each $R^1, R^2, R^3, R^4, R^5$, and $R^6$ ($R^1$-$R^6$) is independently selected from the group consisting of a hydrogen atom and a hydrocarbyl substituent with a primary, a secondary or a tertiary carbon attachment point, said hydrocarbyl group selected from the group consisting of an alkyl group, an alkenyl group, an alkynl group, an aralkyl group, an alkaryl and an aryl group, each alkyl, alkenyl, alkynl, aralkyl, alkaryl or aryl group having 1 to 20 carbon atom and each alkyl group of the aralkyl, or alkaryl groups may be linear, branched or cyclic and the aryl groups may include at least one carbon ring containing 3 to 8 carbon atoms; and any two $R^1$-$R^6$ in the same molecule may be linked to form the at least one carbon ring containing 3 to 8 carbon atoms.

6. The method of claim 4, wherein said adhesion layer comprises O-(vinyloxybutyl)-H-(triethoxysilylpropyl)-urethane.

7. The method of claim 1, wherein said etch barrier composition comprises:

(1) between about 60% and about 99.8% by weight of at least one vinyl ether having at least two vinyl ether groups and at least about 6% by weight of at least one of silicon, germanium, tin and titanium or (2) between about 60% to about 99.8% by weight of at least one vinyl ether having at least two vinyl ether groups, less then about 40% by weight of at least one vinyl ether having one vinyl ether group and at least about 6% by weight of at least one of silicon, germanium, tin and titanium;

wherein the at least one vinyl ether having one vinyl ether group is represented by at least one of the following structures (II and III) and wherein the at least one vinyl ether having at least two vinyl ether groups is represented by at least one of the following structures (IV, V, VI and VII):

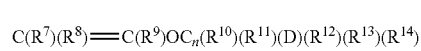
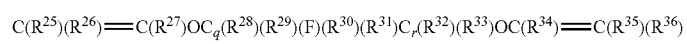
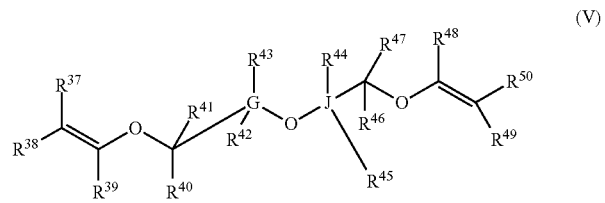
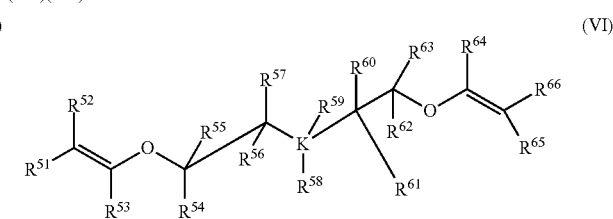
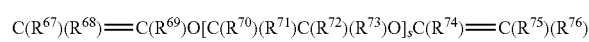

where each D, E, F, G, J, and K is independently selected from the group consisting of a carbon atom, a silicon atom, a germanium atom, a titanium atom and a tin atom;

where n, o, p, q, r, and s is independently selected from the group of integers consisting of 0, 1, 2, 3, 4, 5 and 6;

where each $R^7, R^8, R^9, R^{10}, R^{11}, R^{12}, R^{13}, R^{14}, R^{15}, R^{16}, R^{17}, R^{18}, R^{19}, R^{20}, R^{21}, R^{22}, R^{23}, R^{24}, R^{25}, R^{26}, R^{27}, R^{28}, R^{29}, R^{30}, R^{31}, R^{32}, R^{33}, R^{34}, R^{35}, R^{36}, R^{37}, R^{38}, R^{39}, R^{40}, R^{41}, R^{42}, R^{43}, R^{44}, R^{45}, R^{46}, R^{47}, R^{48}, R^{49}, R^{50}, R^{51}, R^{52}, R^{53}, R^{54}, R^{55}, R^{56}, R^{57}, R^{58}, R^{59}, R^{60}, R^{61}, R^{62}, R^{63}, R^{64}, R^{65}, R^{66}, R^{67}, R^{68}, R^{69}, R^{70}, R^{71}, R^{72}, R^{73}, R^{74}, R^{75}$ and $R^{76}$ ($R^7$ to $R^{76}$) is independently selected from the group consisting of a hydrogen atom and a hydrocarbyl substituent with a primary, a secondary or a tertiary carbon attachment point;

where the hydrocarbyl substituent is selected from the group consisting of a linear alkyl group having 1 to 6 carbon atoms, a linear alkoxy group having 1 to 6 carbon atoms, a branched alkyl having 2 to 12 carbon atoms, a branched alkoxy group having 2 to 12 carbon atoms, a cycloalkyl group having 3 to 17 carbon atoms, a bicycloalkyl group having 3 to 17 carbon atoms, a cycloalkoxy group having 3 to 17 carbon atoms, a bicycloalkoxy group having 3 to 17 carbon atoms, a fluorinated linear alkyl group having 2 to 12 carbon atoms, a fluorinated branched alkyl group having 2 to 12 carbon atoms, a fluorinated cycloalkyl group having 3 to 17 carbon atoms, an aryl group, an aralkyl group, an alkaryl group, an alkenyl group, an alkynyl, a cycloalkenyl group, a dihydropyranyl group, a dihydrofuranyl group, an alkalkenyl group, an alkenylalkyl group, an alkynyl group, an alkalkynyl group, an alkynylalkyl group, a trifluoromethyl group, a trifluoroethyl group, a trifluoropropyl group, a cyanopropyl group, a tris-trialkysily group, a tris-triarylsilyl group, a tris-trialkarylsilyl group, a tris-triaralkylsilyl group, a tris-trialkenylsilyl group, a tris-trifluoroalkyl group, a tris-trialkynylsilyl group, a tris-trifluoromethylsilyl group, a tris-trifluoroethylsilyl group, a tris-trifluoropropylsilyl group, and a tris-cyanopropylsilyl group, where the alkyl substituents in the tris-trialkylsilyl group include linear, branched, cyclic or bicyclic alkyl substituents having 1 to 21 carbon atoms, where the aryl substituents in the tris-triarylsilyl group include phenyl, naphthyl or phenanthryl, where the alkaryl substituents in the tris-trialkarylsilyl group include tolyl, where the aralkyl substituents in the tris-triaralkylsilyl group include benzy, where the alkenyl substituents in the tris-trialkenylsilyl group include vinyl, where the fluoroalkyl substituents in the tris-trifluoroalkyl group include linear or branched fluorinated alkyl groups having 2 to 12 carbon atoms, or fluorinated cycloalkyl groups having 3 to 17 carbon atoms, and where the alkynl substituents in the tris-trialkynylsilyl group include ethynyl groups; and where any two $R^7$-$R^{76}$ in the same molecule of the at least one vinyl ether (II, III, IV, V, VI or VII) may be linked to form a carbon ring having 3 to 8 carbon atoms.

8. The method of claim 1, wherein said etch barrier composition comprises $CH_2$=$CHOCH_2Si(CH_3)_2CH_2OCH$=$CH_2$.

9. The method of claim 1, wherein said etch barrier composition includes 1) a photoacid generator and also 2) a stabilizer, a release agent, or both a stabilizer and a release agent.

10. The method of claim 1, wherein said etch barrier composition comprises a photoacid generator selected from the group consisting of sulfonium salts, triphenylsulfonium perfluoromethanesulfonate (triphenylsulfonium triflate), triphenylsulfonium perfluorobutanesulfonate, triphenylsulfonium perfluoropentanesulfonate, triphenylsulfonium perfluorooctanesulfonate, triphenylsulfonium hexafluoroantimonate, triphenylsulfonium hexafluoroarsenate, triphenylsulfonium hexafluorophosphate, triphenylsulfonium bromide, triphenylsulfonium chloride, triphenylsulfonium iodide, 2,4,6-trimethylphenyldiphenylsulfonium perfluorobutanesulfonate, 2,4,6-trimethylphenyldiphenylsulfonium benzenesulfonate, tris(t-butylphenyl)sulfonium, diphenylethylsulfonium chloride, phenacyldimethylsulfonium chloride, halonium salts, diphenyliodonium perfluoromethanesulfonate (diphenyliodonium triflate), diphenyliodonium perfluorobutanesulfonate, diphenyliodonium perfluoropentanesulfonate, diphenyliodonium, diphenyliodonium hexafluoroantimonate, diphenyliodonium hexafluoroarsenate, bis-(t-butylphenyl)iodonium triflate, bis-(t-butylphenyl)-iodonium camphorsulfonate, α, α'-bis-sulfonyl-diazomethanes, bis(p-toluenesulfonyl)diazomethane, methylsulfonyl p-toluenesulfonyldiazomethane, 1-cyclohexylsulfonyl-1-(1,1dimethylethylsulfonyl) diazomethane, bis(cyclohexylsulfonyl) diazomethane, trifluoromethanesulfonate esters of imides and hydroxyimides, (trifluoromethylsulfonyloxy)-bicyclo[2.2.1]hept-5-ene-2,3-dicarboximide (MDT), nitrobenzyl sulfonate esters, 2-nitrobenzyl p-toluenesulfonate, 2,6-dinitrobenzyl p-toluenesulfonate, 2,4-dinitrobenzyl p-trifluoromethylbenzenesulfonate; sulfonyloxynaphthalimides, N-camphorsulfonyloxynaphthalimide and N-pentafluorophenylsulfonyloxynaphthalimide; pyrogallol derivatives (e.g., trimesylate of pyrogallol), naphthoquinone-4-diazides, alkyl disulfones, s-triazine derivatives; sulfonic acid generators, t-butylphenyl-α-(ptoluenesulfonyloxy)-acetate, t-butyl-α-(p-toluenesulfonyloxy)acetate, N-hydroxynaphthalimide dodecane sulfonate (DDSN), benzoin tosylate, and materials represented by the following structure X, XI and XII:

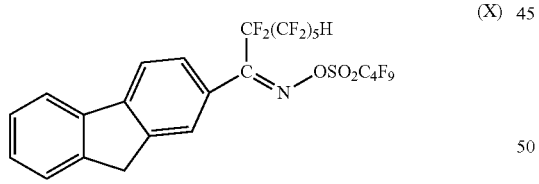

(X)

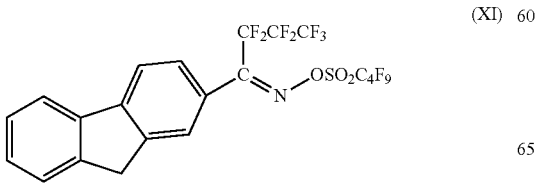

(XI)

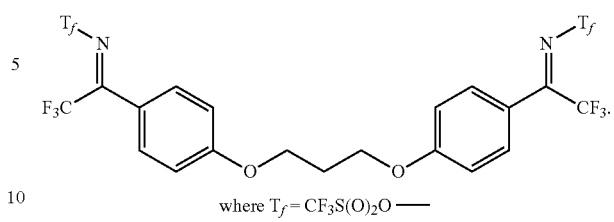

(XII)

where $T_f = CF_3S(O)_2O$ ——

11. The method of claim 1, wherein said etch barrier composition includes a photoacid generator comprised of a mixture of

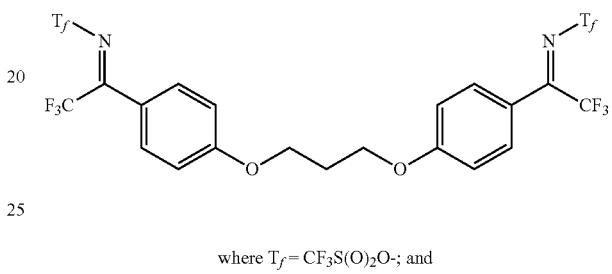

where $T_f = CF_3S(O)_2O-$; and 9-anthracenemethanol, phenothiazene or both 9-anthracenemethanol and phenothiazene.

12. The method of claim 1, wherein said etch barrier composition includes a stabilizer comprising:
at least one of 9-anthracenemethanol, a substituted 9-anthracenementhanol having the structure (VIII), phenothiazine, a substituted phenothiazine having the structure (IX);

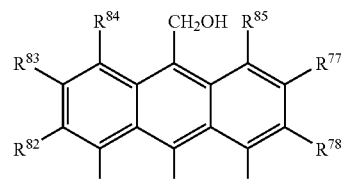

(VIII)

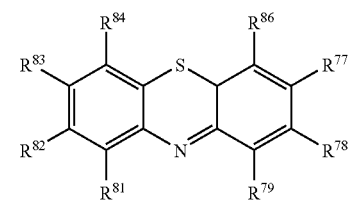

(IX)

where each $R^{77}, R^{78}, R^{79}, R^{80}, R^{81}, R^{82}, R^{83}, R^{84}, R^{85}$ and $R^{86}$ ($R^{77}$-$R^{86}$) is independently selected from the group consisting of a hydrogen atom and a hydrocarbyl substituent with a primary, a secondary or a tertiary carbon attachment point, said hydrocarbyl group selected from the group consisting of an alkyl group having 1 to 20 carbon atoms, an alkenyl group having 1 to 20 carbon atoms, an alkynl group having 1 to 20 carbon atoms, an aralkyl group having 1 to 20 carbon atoms, an alkaryl having 1 to 20 carbon atoms and an aryl group having 1 to 20 carbon atoms;

where, the alkyl groups of the aralkyl and the alkaryl groups may be linear, branched or cyclic and the aryl groups may include at least one carbon ring containing 3 to 8 carbon atoms; and where any two $R^{77}$-$R^{85}$ in the same molecule may be linked to form the at least one carbon ring containing 3 to 8 carbon atoms.

13. The method of claim 1, wherein said etch barrier composition includes a release agent comprising vinyl 2,2,2-trifluoroethyl ether.

14. A method of forming an image, comprising:
forming on a substrate, a transfer layer of a transfer composition;
forming a coating of an adhesion promoter on said transfer layer;
forming on said coating of said adhesion promoter, an etch barrier layer of an etch barrier composition;
pressing a surface of a template into said etch barrier layer, said a template having a relief pattern on said surface, said etch barrier layer filling voids in said relief pattern, said template not contacting said transfer layer;
exposing said etch barrier layer to actinic radiation, said actinic radiation converting said etch barrier layer to a cured etch barrier layer having thick and thin regions corresponding to said relief pattern;
removing said template;
removing said thin regions of said cured etch barrier layer;
removing regions of said transfer layer and said regions of said coating of said adhesion promoter not protected by said etch barrier layer;
removing regions of said substrate not protected by said transfer layer and removing any remaining etch barrier layer; and
removing any remaining transfer layer by dissolving said remaining transfer layer in at least one of an aqueous base and an organic solvent.

15. A method of forming an image, comprising:
forming on a substrate, a transfer layer of a transfer composition;
forming on said transfer layer, an etch barrier layer of an etch barrier composition, said etch barrier composition including a release agent;
pressing a surface of a template into said etch barrier layer, said a template having a relief pattern on said surface, said etch barrier layer filling voids in said relief pattern, said template not contacting said transfer layer;
exposing said etch barrier layer to actinic radiation, said actinic radiation converting said etch barrier layer to a cured etch barrier layer having thick and thin regions corresponding to said relief pattern;
removing said template;
removing said thin regions of said cured etch barrier layer;
removing regions of said transfer layer not protected by said etch barrier layer;
removing regions of said substrate not protected by said transfer layer and removing any remaining etch barrier layer; and
removing any remaining transfer layer by dissolving said remaining transfer layer in at least one of an aqueous base and an organic solvent.

16. A method of forming an image, comprising:
forming on a substrate, a transfer layer of a transfer composition;
forming on said transfer layer, a molding layer of a molding composition;
pressing a surface of a template into said molding layer, said template having a relief pattern on said surface, said molding layer filling voids in said relief pattern, said template not contacting said transfer layer;
exposing said molding layer to actinic radiation, said actinic radiation converting said molding layer to a cured molding layer having thick and thin regions corresponding to said relief pattern;
removing said template;
forming a layer of a backfill composition on said cured molding layer;
exposing said layer of said backfill composition to actinic radiation, said actinic radiation converting said layer of said backfill composition to a cured backfill layer;
removing regions of said cured backfill layer to form etch barrier islands of said cured backfill layer between said thick regions of said cured molding layer, top surfaces of said thick regions of said cured molding layer exposed between said etch barrier islands;
removing said thick regions of said cured molding layer;
removing regions of said transfer layer not protected by said thin regions of said cured molding layer and said etch barrier islands;
removing regions of said substrate not protected by said transfer layer and removing any remaining etch barrier islands; and
removing any remaining transfer layer.

17. The method of claim 16, wherein remaining transfer layer is removed by dissolving said transfer layer in at least one of an aqueous base and an organic solvent.

18. The method of claim 16, wherein said transfer layer composition comprises poly(vinylbenzoic acid).

19. The method of claim 16, further including:
forming an adhesion layer between said substrate and said transfer layer.

20. The method of claim 16, further including:
forming an adhesion layer between said transfer layer and said molding layer.

21. The method of claim 20, wherein said adhesion layer comprises:

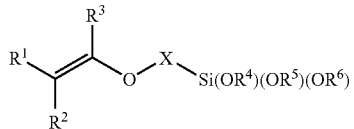

where X is a linking group selected from the group consisting of —C(O)O—, —C(O)—, —OC(O)—, —O—C(O)—C(O)—O—, NHC(O)—O—, —O—C(O)—O—, a linear or a branched alkylene having 1 to 7 carbon atoms, a cycloalkylene having 3 to 17 carbon atoms, an alkylcycloalkylene having 4 to 20 carbon atoms and a cycloalkylalkylene having 4 to 20 carbon atoms;

where each $R^1$, $R^2$, $R^3$, $R^4$, $R^5$, and $R^6$ ($R^1$-$R^6$) is independently selected from the group consisting of a hydrogen atom and a hydrocarbyl substituent with a primary, a secondary or a tertiary carbon attachment point, said hydrocarbyl group selected from the group consisting of an alkyl group, an alkenyl group, an alkynl group, an aralkyl group, an alkaryl and an aryl group, each alkyl, alkenyl, alkynl, aralkyl, alkaryl or aryl group having 1 to 20 carbon atom and each alkyl group of the aralkyl, or alkaryl groups may be linear, branched or cyclic and the aryl groups may include at least one carbon ring containing 3 to 8 carbon atoms; and any two R¹-R⁶ in the same molecule may be linked to form the at least one carbon ring containing 3 to 8 carbon atoms.

22. The method of claim 20, wherein said adhesion layer comprises O-(vinyloxybutyl)-H-(triethoxysilylpropyl)-urethane.

23. The method of claim 16, wherein said molding composition comprises:
(1) between about 60% and about 99.8% by weight of at least one vinyl ether having at least two vinyl ether groups and at least about 6% by weight of at least one of silicon, germanium, tin and titanium or (2) between about 60% to about 99.8% by weight of at least one vinyl ether having at least two vinyl ether groups, less then about 40% by weight of at least one vinyl ether having one vinyl ether group and at least about 6% by weight of at least one of silicon, germanium, tin and titanium;
wherein the at least one vinyl ether having one vinyl ether group is represented by at least one of the following structures (XIII and XIV) and wherein the at least one vinyl ether having at least two vinyl ether groups is represented by at least one of the following structures (XV, XVI, XVII and XVIII):

selected from the group consisting of a linear alkyl or a linear alkoxy group having 1 to 6 carbon atoms, a branched alkyl or branched alkoxy group having 2 to 12 carbon atoms, a cycloalkyl, a bicycloalkyl, a cycloalkoxy or a bicycloalkoxy group having 3 to 17 carbon atoms, a fluorinated linear alkyl group having 2 to 12 carbon atoms, a fluorinated branched alkyl group having 2 to 12 carbon atoms, a fluorinated cycloalkyl group having 3 to 17 carbon atoms, an aryl group, an aralkyl group, an alkaryl group, an alkenyl group, an alkynyl, a cycloalkenyl group, a dihydropyranyl group, a dihydrofuranyl group, an alkalkenyl group, an alkenylalkyl group, an alkynyl group, an alkalkynyl group, an alkynylalkyl group, a trifluoromethyl group, a trifluoroethyl group, a trifluoropropyl group, a cyanopropyl group and where the fluoroalkyl substituents in the tris-trifluoroalkyl group include linear or branched fluorinated alkyl groups having 2 to 12 carbon atoms, or fluorinated cycloalkyl groups having 3 to 17 carbon atoms.

24. The method of claim 16, wherein said backfill composition comprises:

(XIII)

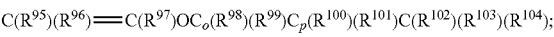
(XIV)

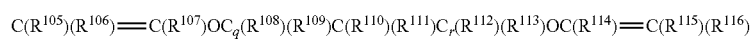
(XV)

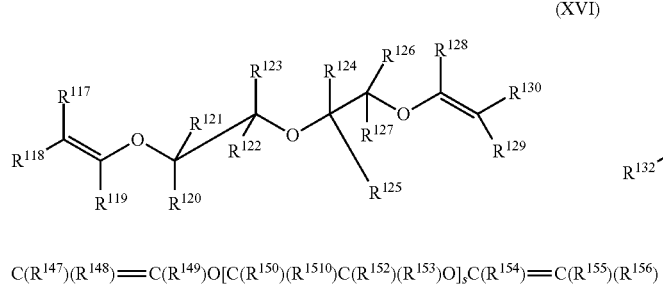
(XVI)

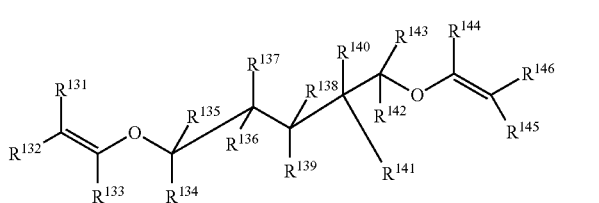
(XVII)

$C(R^{147})(R^{148})\!=\!\!=\!\!C(R^{149})O[C(R^{150})(R^{1510})C(R^{152})(R^{153})O]_sC(R^{154})\!=\!\!=\!\!C(R^{155})(R^{156})$
(XVIII)

where n, o, p, q, r and s are independently selected from the group consisting of the integers 0, 1, 2, 3, 4, 5, and 6; and where each $R^{87}, R^{88}, R^{89}, R^{90}, R^{91}, R^{92}, R^{93}, R^{94}, R^{95}, R^{96}, R^{97}, R^{98}, R^{99}, R^{100}, R^{101}, R^{102}, R^{103}, R^{104}, R^{105}, R^{106}, R^{107}, R^{108}, R^{109}, R^{110}, R^{111}, R^{112}, R^{113}, R^{114}, R^{115}, R^{116}, R^{117}, R^{118}, R^{119}, R^{120}, R^{121}, R^{122}, R^{123}, R^{124}, R^{125}, R^{126}, R^{127}, R^{128}, R^{129}, R^{130}, R^{131}, R^{132}, R^{133}, R^{134}, R^{135}, R^{136}, R^{137}, R^{138}, R^{139}, R^{140}, R^{141}, R^{142}, R^{143}, R^{144}, R^{145}, R^{146}, R^{147}, R^{148}, R^{149}, R^{150}, R^{151}, R^{152}, R^{153}, R^{154}$ and $R^{155}$ ($R^{87}$ to $R^{155}$) is independently selected from the group consisting of a hydrogen atom, a fluorine atom and a hydrocarbyl substituent with at least one of a primary, secondary and a tertiary carbon attachment point, where the hydrocarbyl substituent is (1) between about 60% and about 99.8% by weight of at least one vinyl ether having at least two vinyl ether groups or (2) between about 60% to about 99.8% by weight of at least one vinyl ether having at least two vinyl ether groups and less then about 40% by weight of at least one vinyl ether having one vinyl ether group;
wherein the at least one vinyl ether having one vinyl ether group is represented by at least one of the following structures (II and III) and wherein the at least one vinyl ether having at least two vinyl ether groups is represented by at least one of the following structures (IV, V, VI and VII):

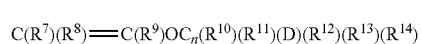   (II)

   (III)

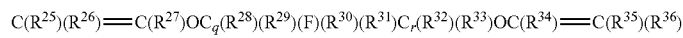   (IV)

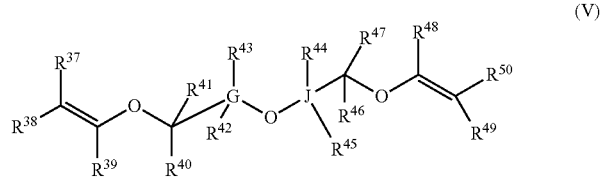   (V)

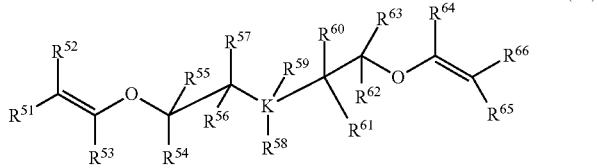   (VI)

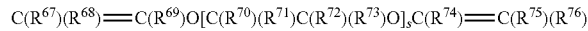   (VII)

where each D, E, F, G, J, and K is independently selected from the group consisting of a carbon atom, a silicon atom, a germanium atom, a titanium atom and a tin atom;
where n, o, p, q, r, and s is independently selected from the group of integers consisting of 0, 1, 2, 3, 4, 5 and 6;
where each $R^7$, $R^8$, $R^9$, $R^{10}$, $R^{11}$, $R^{12}$, $R^{13}$, $R^{14}$, $R^{15}$, $R^{16}$, $R^{17}$, $R^{18}$, $R^{19}$, $R^{20}$, $R^{21}$, $R^{22}$, $R^{23}$, $R^{24}$, $R^{25}$, $R^{26}$, $R^{27}$, $R^{28}$, $R^{29}$, $R^{30}$, $R^{31}$, $R^{32}$, $R^{33}$, $R^{34}$, $R^{35}$, $R^{36}$, $R^{37}$, $R^{38}$, $R^{39}$, $R^{40}$, $R^{41}$, $R^{42}$, $R^{43}$, $R^{44}$, $R^{45}$, $R^{46}$, $R^{47}$, $R^{48}$, $R^{49}$, $R^{50}$, $R^{51}$, $R^{52}$, $R^{53}$, $R^{54}$, $R^{55}$, $R^{56}$, $R^{57}$, $R^{58}$, $R^{59}$, $R^{60}$, $R^{61}$, $R^{62}$, $R^{63}$, $R^{64}$, $R^{65}$, $R^{66}$, $R^{67}$, $R^{68}$, $R^{69}$, $R^{70}$, $R^{71}$, $R^{72}$, $R^{73}$, $R^{74}$, $R^{75}$ and $R^{76}$ ($R^7$ to $R^{76}$) is independently selected from the group consisting of a hydrogen atom and a hydrocarbyl substituent with a primary, a secondary or a tertiary carbon attachment point;
where the hydrocarbyl substituent is selected from the group consisting of a linear alkyl group having 1 to 6 carbon atoms, a linear alkoxy group having 1 to 6 carbon atoms, a branched alkyl having 2 to 12 carbon atoms, a branched alkoxy group having 2 to 12 carbon atoms, a cycloalkyl group having 3 to 17 carbon atoms, a bicycloalkyl group having 3 to 17 carbon atoms, a cycloalkoxy group having 3 to 17 carbon atoms, a bicycloalkoxy group having 3 to 17 carbon atoms, a fluorinated linear alkyl group having 2 to 12 carbon atoms, a fluorinated branched alkyl group having 2 to 12 carbon atoms, a fluorinated cycloalkyl group having 3 to 17 carbon atoms, an aryl group, an aralkyl group, an alkaryl group, an alkenyl group, an alkynyl, a cycloalkenyl group, a dihydropyranyl group, a dihydrofuranyl group, an alkalkenyl group, an alkenylalkyl group, an alkynyl group, an alkalkynyl group, an alkynylalkyl group, a trifluoromethyl group, a trifluoroethyl group, a trifluoropropyl group, a cyanopropyl group, a tris-trialkysily group, a tris-triarylsilyl group, a tris-trialkarylsilyl group, a tris-triaralkylsilyl group, a tris-trialkenylsilyl group, a tris-trifluoroalkyl group, a tris-trialkynylsilyl group, a tris-trifluoromethylsilyl group, a tris-trifluoroethylsilyl group, a tris-trifluoropropylsilyl group, and a tris-cyanopropylsilyl group,
where the alkyl substituents in the tris-trialkylsilyl group include linear, branched, cyclic or bicyclic alkyl substituents having 1 to 21 carbon atoms, where the aryl substituents in the tris-triarylsilyl group include phenyl, naphthyl or phenanthryl, where the alkaryl substituents in the tris-trialkarylsilyl group include tolyl, where the aralkyl substituents in the tris-triaralkylsilyl group include benzy, where the alkenyl substituents in the tris-trialkenylsilyl group include vinyl, where the fluoroalkyl substituents in the tris-trifluoroalkyl group include linear or branched fluorinated alkyl groups having 2 to 12 carbon atoms, or fluorinated cycloalkyl groups having 3 to 17 carbon atoms, and where the alkynl substituents in the tris-trialkynylsilyl group include ethynyl groups; and
where any two $R^7$-$R^{76}$ in the same molecule of the at least one vinyl ether (II, III, IV, V, VI or VII) may be linked to form a carbon ring having 3 to 8 carbon atoms.

25. The method of claim 16, wherein said backfill composition comprises $CH_2=CHOCH_2Si(CH_3)_2CH_2OCH=CH_2$.

26. The method of claim 16, wherein said backfill composition is selected from the group consisting of organic polymers containing silicon, germanium, tin, titanium or other Group IVA/IVB metal atoms, siloxane polymers, spin-on-glass, organo silicate glass materials and silsesquioxane resins represented by the formulas $-(SiO_2)n-$, $-(R'SiO_{3/2})_{n^-}$, $-_{(R'_2)}SiO)n-$ and $-(R''Si_2O_3)n-$, where R' is selected from the group consisting of an alkyl group having 1 to 3 carbon atoms, an aryl group having 6 to 12 carbon atoms, and a cycloalkyl group having 6 to 12 carbon atoms, and wherein R'' is selected from the group consisting of an alkylene group having 1 to 2 carbon atoms and a cycloalkylene group having 6 to 12 carbon atoms.

27. The method of claim 16, wherein:
said backfill composition or said molding composition or both said backfill composition and said molding composition include a photoacid generator; and
said backfill composition or said molding composition or both said backfill composition and said molding composition include, a stabilizer, a release agent, or both a stabilizer and a release agent.

28. The method of claim 16, wherein said backfill composition, said molding composition or both and said backfill composition and said molding composition include a photoacid generator selected from the group consisting of sulfonium salts, triphenylsulfonium perfluoromethanesulfonate (triphenylsulfonium triflate), triphenylsulfonium perfluorobutanesulfonate, triphenylsulfonium perfluoropentanesulfonate, triphenylsulfonium perfluorooctanesulfonate, triphenylsulfonium hexafluoroantimonate, triphenylsulfonium hexafluoroarsenate, triphenylsulfonium hexafluorophosphate, triphenylsulfonium bromide, triphenylsulfonium chloride, triphenylsulfonium iodide, 2,4,6-trimethylphenyldiphenylsulfonium perfluorobutanesulfonate, 2,4,6-trimethylphenyldiphenylsulfonium benzenesulfonate, tris(t-butylphenyl)sulfonium, diphenylethylsulfonium chloride, phenacyldimethylsulfonium chloride, halonium salts, diphenyliodonium perfluoromethanesulfonate (diphenyliodonium triflate), diphenyliodonium perfluorobutanesulfonate, diphenyliodonium perfluoropentanesulfonate, diphenyliodonium, diphenyliodonium hexafluoroantimonate, diphenyliodonium hexafluoroarsenate, bis-(t-butylphenyl)iodonium triflate, bis-(t-butylphenyl)-iodonium camphorsulfonate, α, α'-bis-sulfonyl-diazomethanes, bis(p-toluenesulfonyl)diazomethane, methylsulfonyl p-toluenesulfonyldiazomethane, 1-cyclohexylsulfonyl-1-(1,1dimethylethylsulfonyl) diazomethane, bis(cyclohexylsulfonyl)diazomethane, trifluoromethanesulfonate esters of imides and hydroxyimides, (trifluoromethylsulfonyloxy)-bicyclo[2.2.1]hept-5-ene-2,3-dicarboximide (MDT), nitrobenzyl sulfonate esters, 2-nitrobenzyl p-toluenesulfonate, 2,6-dinitrobenzyl p-toluenesulfonate, 2,4-dinitrobenzyl p-trifluoromethylbenzenesulfonate; sulfonyloxynaphthalimides, N-camphorsulfonyloxynaphthalimide and N-pentafluorophenylsulfonyloxynaphthalimide; pyrogallol derivatives (e.g., trimesylate of pyrogallol), naphthoquinone-4-diazides, alkyl disulfones, s-triazine derivatives; sulfonic acid generators, t-butylphenyl-α-(ptoluenesulfonyloxy)-acetate, t-butyl-α-(p-toluenesulfonyloxy)acetate, N-hydroxynaphthalimide dodecane sulfonate (DDSN), benzoin tosylate, and materials represented by the following structure X, XI and XII:

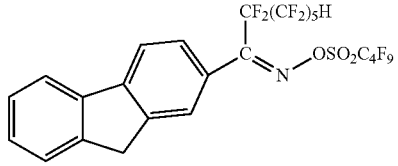

(X)

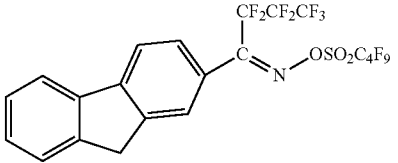

(XI)

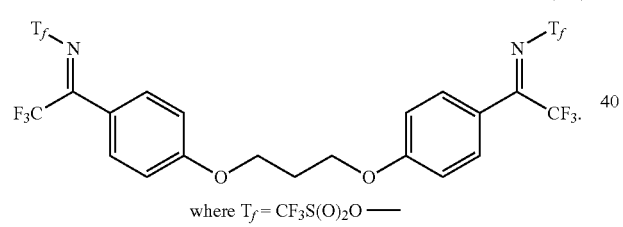

(XII)

where $T_f = CF_3S(O)_2O-$

29. The method of claim 16, wherein said backfill composition, said molding composition or both said backfill composition and said molding composition include a photoacid generator comprising a mixture of

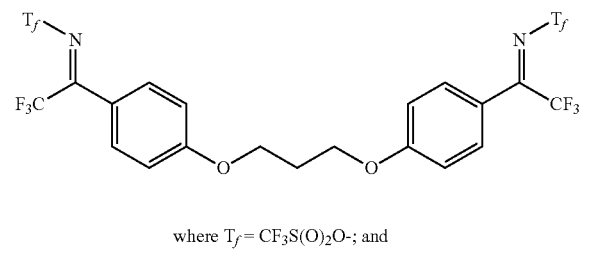

where $T_f = CF_3S(O)_2O-$; and 9-anthracenemethanol, phenothiazene or both 9-anthracenemethanol and phenothiazene.

30. The method of claim 16, wherein said backfill composition, said molding composition or both said backfill composition and said molding composition include a stabilizer comprising:

at least one of 9-anthracenemethanol, a substituted 9-anthracenemethanol having the structure (VIII), phenothiazine, a substituted phenothiazine having the structure (IX);

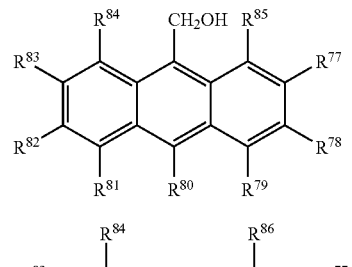

(VIII)

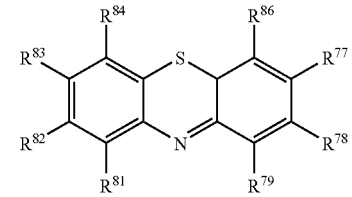

(IX)

where each $R^{77}, R^{78}, R^{79}, R^{80}, R^{81}, R^{82}, R^{83}, R^{84}, R^{85}$ and $R^{86}$ ($R^{77}$-$R^{86}$) is independently selected from the group consisting of a hydrogen atom and a hydrocarbyl substituent with a primary, a secondary or a tertiary carbon attachment point, said hydrocarbyl group selected from the group consisting of an alkyl group having 1 to 20 carbon atoms, an alkenyl group having 1 to 20 carbon atoms, an alkynl group having 1 to 20 carbon atoms, an aralkyl group having 1 to 20 carbon atoms, an alkaryl having 1 to 20 carbon atoms and an aryl group having 1 to 20 carbon atoms;

where, the alkyl groups of the aralkyl and the alkaryl groups may be linear, branched or cyclic and the aryl groups may include at least one carbon ring containing 3 to 8 carbon atoms; and where any two $R^{77}$-$R^{85}$ in the same molecule may be linked to form the at least one carbon ring containing 3 to 8 carbon atoms.

31. The method of claim 16, wherein said backfill composition, said molding composition or both said backfill composition and said molding composition include a release agent comprising vinyl 2,2,2-trifluoroethyl ether or $(R^7)(R^8)=C(R^9)OC_n(R^{10})(R^{11})(D)(R^{12})(R^{13})(R^{14})$ wherein D is a carbon atom, wherein n is 1, wherein $R^7, R^8, R^9, R^{10}$ and $R^{11}$ are H, and where $R^{12}, R^{13}$ and $R^{14}$ are fluorine groups.

32. The method of claim 16, wherein said forming on said thin regions of said cured molding layer etch barrier islands includes:
 forming a layer of said backfill composition on said cured molding layer; and
 performing a planarizing reactive ion etch to remove said layer of said backfill composition from over said thick regions of said cured molding layer.

33. The method of claim 16, wherein said forming on said thin regions of said cured molding layer, etch barrier islands includes:
 forming a layer of said backfill composition on said cured molding layer; and
 performing a chemical mechanical polishing to remove said cured backfill layer from over said thick regions of said cured molding layer but not from over said thin regions of said cured molding layer.

* * * * *